US011669953B2

(12) United States Patent
Nagatomo et al.

(10) Patent No.: US 11,669,953 B2
(45) Date of Patent: Jun. 6, 2023

(54) PATTERN MATCHING DEVICE AND COMPUTER PROGRAM FOR PATTERN MATCHING

(71) Applicant: Hitachi High-Technologies Corporation, Tokyo (JP)

(72) Inventors: Wataru Nagatomo, Tokyo (JP); Yuichi Abe, Tokyo (JP); Mitsuji Ikeda, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 15/544,643

(22) PCT Filed: Jan. 30, 2015

(86) PCT No.: PCT/JP2015/052607
§ 371 (c)(1),
(2) Date: Jul. 19, 2017

(87) PCT Pub. No.: WO2016/121073
PCT Pub. Date: Aug. 4, 2016

(65) Prior Publication Data
US 2018/0005363 A1 Jan. 4, 2018

(51) Int. Cl.
G06T 7/00 (2017.01)
G01B 15/00 (2006.01)
(Continued)

(52) U.S. Cl.
CPC .............. *G06T 7/001* (2013.01); *G01B 15/00* (2013.01); *G06T 3/0068* (2013.01); *G06T 7/13* (2017.01);
(Continued)

(58) Field of Classification Search
CPC .......... G06T 3/0068; G06T 7/12; G06T 7/73; G06T 7/74; G06T 7/75;
(Continued)

(56) References Cited

U.S. PATENT DOCUMENTS 6,627,888 B2    9/2003  Yamaguchi et al.
7,019,293 B1 *  3/2006  Hamada ................. G01B 15/00
                                              250/310

(Continued)

FOREIGN PATENT DOCUMENTS

JP      7-86349 A       3/1995
JP      11-175701 A     7/1999
(Continued)

OTHER PUBLICATIONS

Govyadinov, A.A., Konecná, A., Chuvilin, A. et al. Probing low-energy hyperbolic polaritons in van der Waals crystals with an electron microscope. Nat Commun 8, 95 (2017). https://doi.org/10.1038/s41467-017-00056-y (Year: 2017).*

(Continued)

*Primary Examiner* — Claire X Wang
*Assistant Examiner* — Stephen M Brinich
(74) *Attorney, Agent, or Firm* — Crowell & Moring LLP

(57) ABSTRACT

The purpose of the present invention is to provide a pattern matching device and computer program that carry out highly accurate positioning even if edge positions and numbers change. The present invention proposes a computer program and a pattern matching device wherein a plurality of edges included in first pattern data to be matched and a plurality of edges included in second pattern data to be matched with the first pattern data are associated, a plurality of different association combinations are prepared, the plurality of association combinations are evaluated using index values for the plurality of edges, and matching processing is carried out using the association combinations selected through the evaluation.

9 Claims, 13 Drawing Sheets

(51) Int. Cl.
  *G06T 7/73* (2017.01)
  *G06T 7/13* (2017.01)
  *G06K 9/46* (2006.01)
  *H01J 37/28* (2006.01)
  *G06K 9/62* (2022.01)
  *G06V 10/44* (2022.01)
  *G06V 10/75* (2022.01)
  *G06T 3/00* (2006.01)
  *H01J 37/26* (2006.01)

(52) U.S. Cl.
  CPC ............... *G06T 7/74* (2017.01); *G06V 10/44* (2022.01); *G06V 10/751* (2022.01); *G06V 10/752* (2022.01); *H01J 37/261* (2013.01); *H01J 37/28* (2013.01); *G06T 2207/10061* (2013.01); *G06T 2207/30148* (2013.01); *H01J 2237/28* (2013.01); *H01J 2237/2817* (2013.01)

(58) Field of Classification Search
  CPC ........... G06T 2207/10061; G06T 2207/30148; G01B 15/00; G01B 15/04; G06K 9/4604; G06K 9/4609; G06K 9/4614; G06K 9/62; G06K 9/6202; G06K 9/6204; G06K 9/6205; H01J 2237/28; H01J 2237/2812; H01J 2237/2817; H01J 2237/2801; G06V 10/44; G06V 10/40; G06V 10/751; G06V 10/7515; G06V 10/752
  USPC .......................... 382/144–147, 151–152, 131
  See application file for complete search history.

(56) References Cited

U.S. PATENT DOCUMENTS

| | | | |
|---|---|---|---|
| 7,235,782 B2 | 6/2007 | Takane et al. | |
| 8,809,780 B2* | 8/2014 | Wollenhaupt | B23K 15/0086 |
| | | | 250/307 |
| 9,043,734 B2* | 5/2015 | Fujimura | G06F 30/394 |
| | | | 716/53 |
| 9,858,659 B2* | 1/2018 | Minakawa | G06T 7/001 |
| 2005/0173633 A1* | 8/2005 | Tanaka | G01N 23/2251 |
| | | | 250/311 |
| 2008/0193029 A1* | 8/2008 | Kamata | G06K 9/4604 |
| | | | 382/249 |
| 2008/0197280 A1* | 8/2008 | Tanaka | G01N 23/225 |
| | | | 250/306 |
| 2009/0039263 A1* | 2/2009 | Matsuoka | G03F 7/70616 |
| | | | 250/311 |
| 2009/0226096 A1* | 9/2009 | Namai | G06K 9/4609 |
| | | | 382/199 |
| 2013/0336575 A1* | 12/2013 | Dalla-Torre | G06T 7/001 |
| | | | 382/149 |
| 2014/0105482 A1* | 4/2014 | Wu | G06T 7/001 |
| | | | 382/149 |
| 2015/0199583 A1 | 7/2015 | Nagatomo et al. | |
| 2015/0357158 A1* | 12/2015 | Suzuki | H01J 37/30 |
| | | | 250/307 |
| 2017/0343340 A1* | 11/2017 | Kawada | H01J 37/317 |
| 2018/0182595 A1* | 6/2018 | Yokosuka | G01B 15/00 |

FOREIGN PATENT DOCUMENTS

| | | |
|---|---|---|
| JP | 2001-222714 A | 8/2001 |
| JP | 2006-260311 A | 9/2006 |
| JP | 4199939 B2 | 12/2008 |
| JP | 4218171 B2 | 2/2009 |
| JP | 2014-26521 A | 2/2014 |
| JP | 2014-126892 A | 7/2014 |

OTHER PUBLICATIONS

International Search Report (PCT/ISA/210) issued in PCT Application No. PCT/JP2015/052607 dated Apr. 21, 2015 with English translation (5 pages).
Japanese-language Written Opinion (PCT/ISA/237) issued in PCT Application No. PCT/JP2015/052607 dated Apr. 21, 2015 (3 pages).

\* cited by examiner

[Fig. 1]
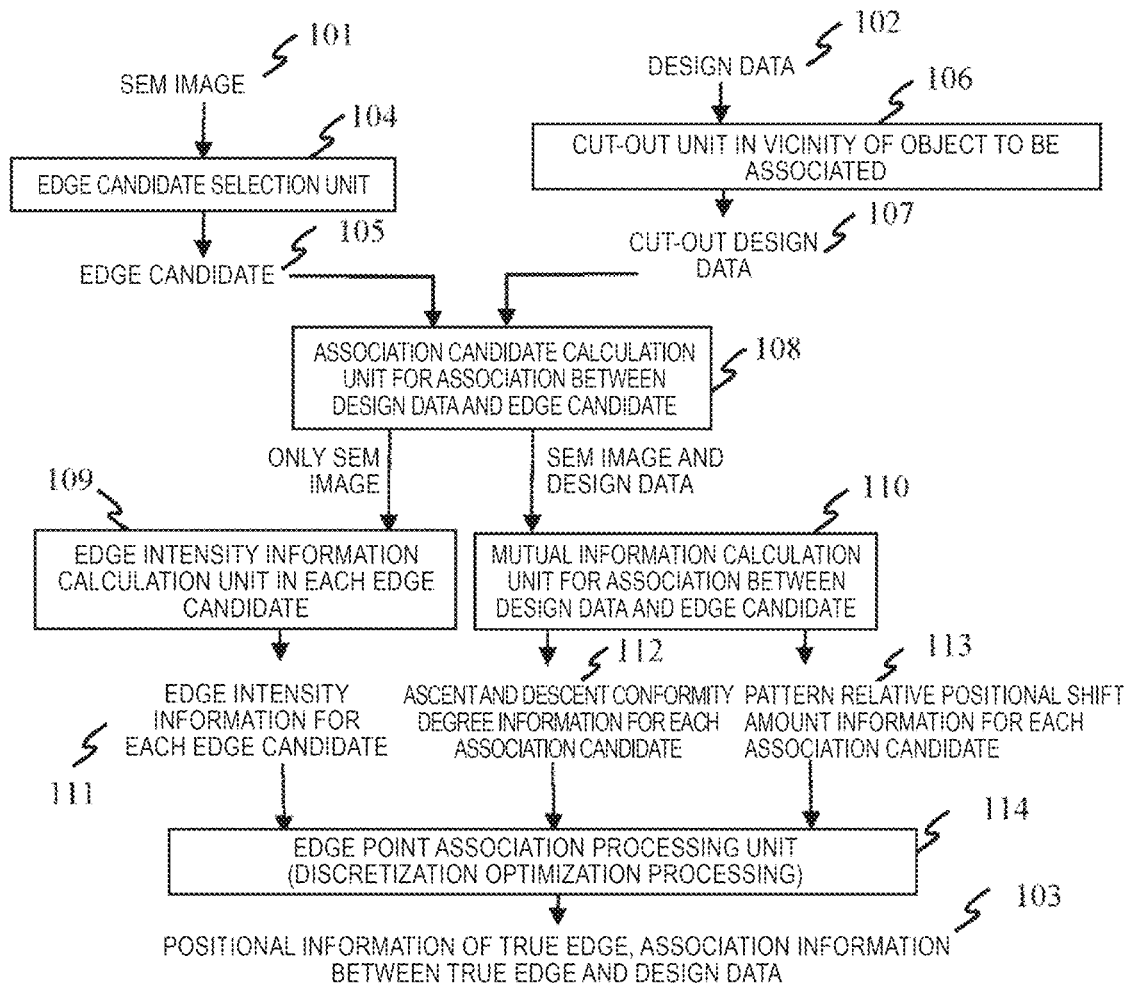

[Fig. 4]
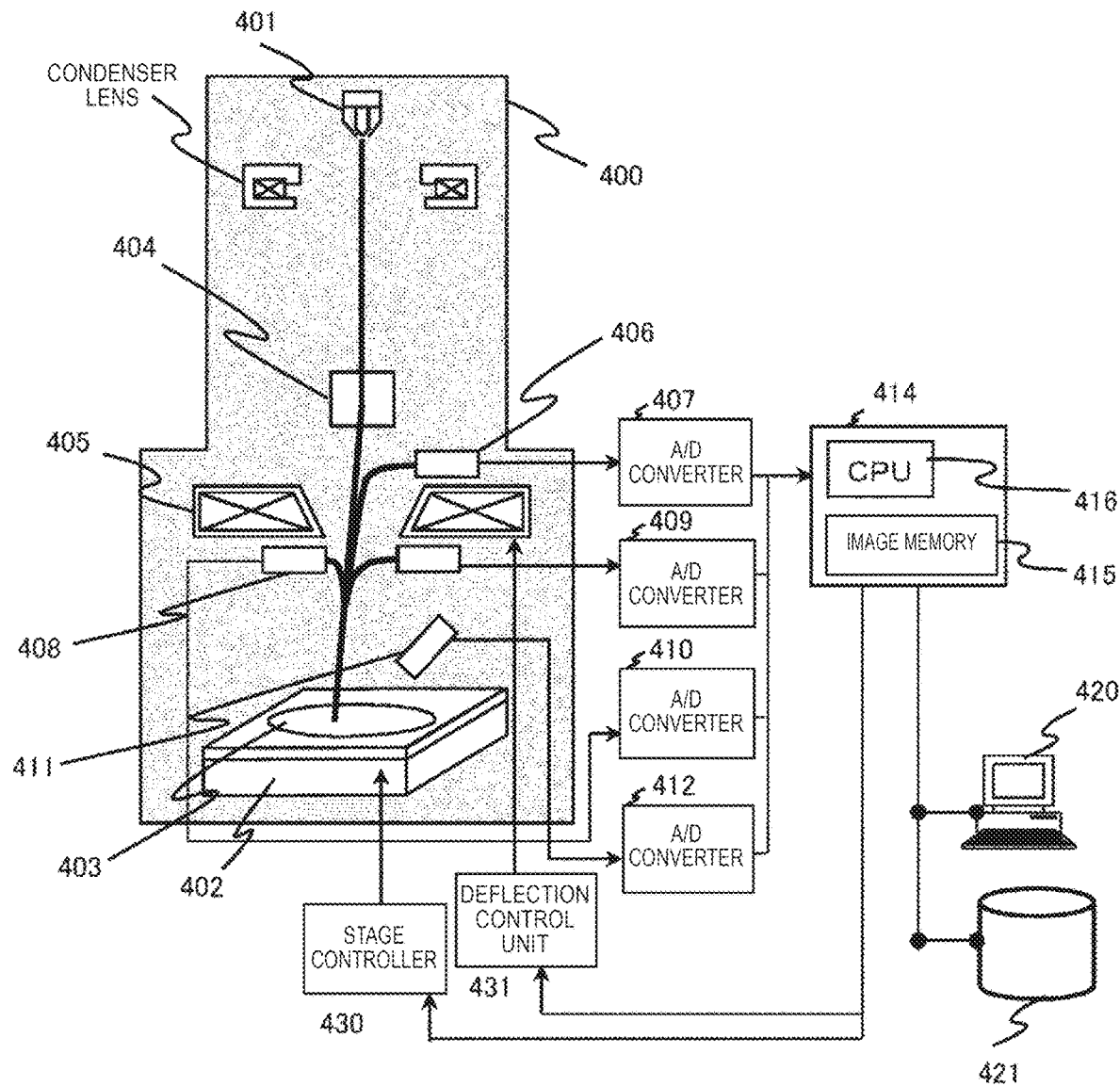

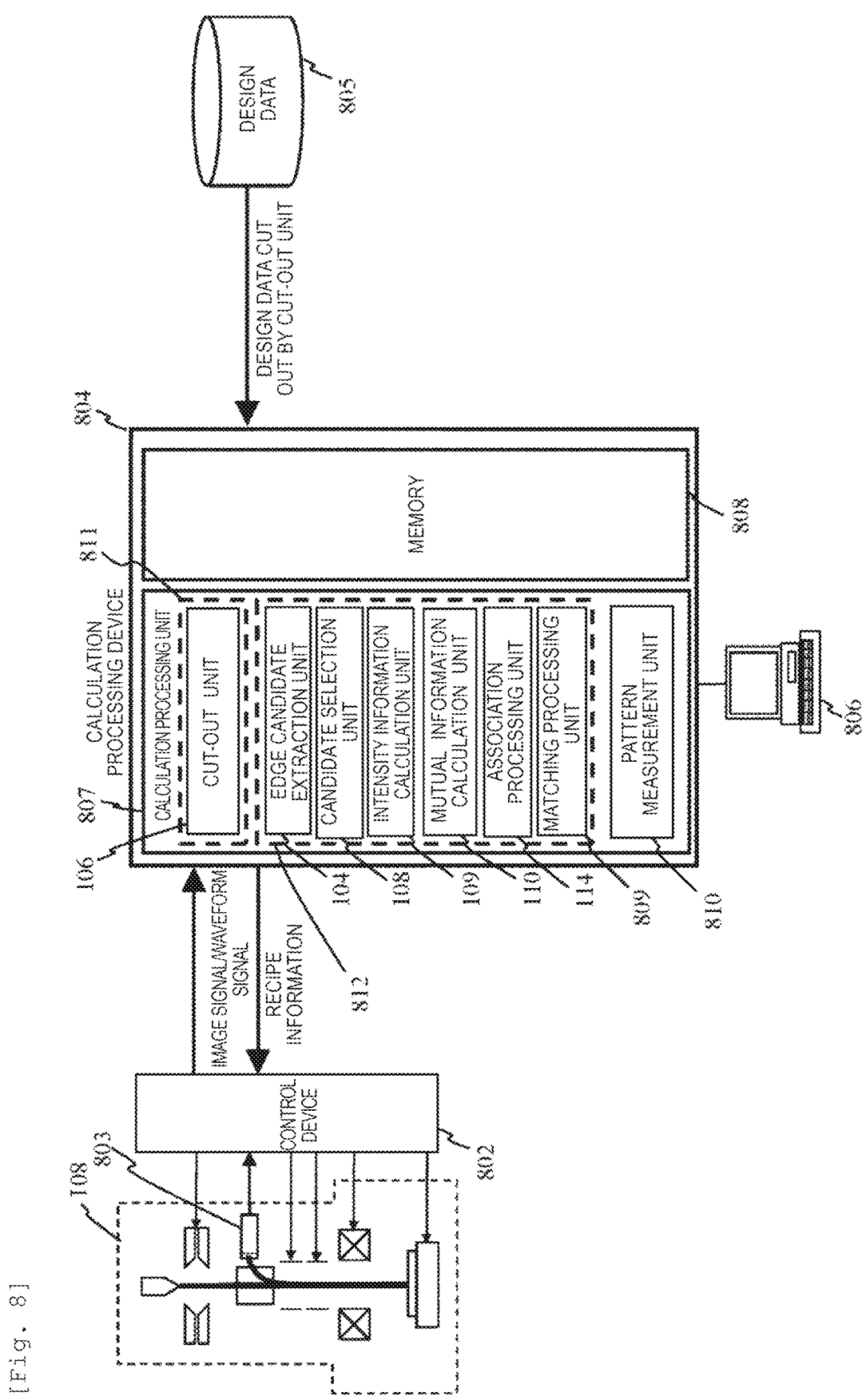

[Fig. 11]
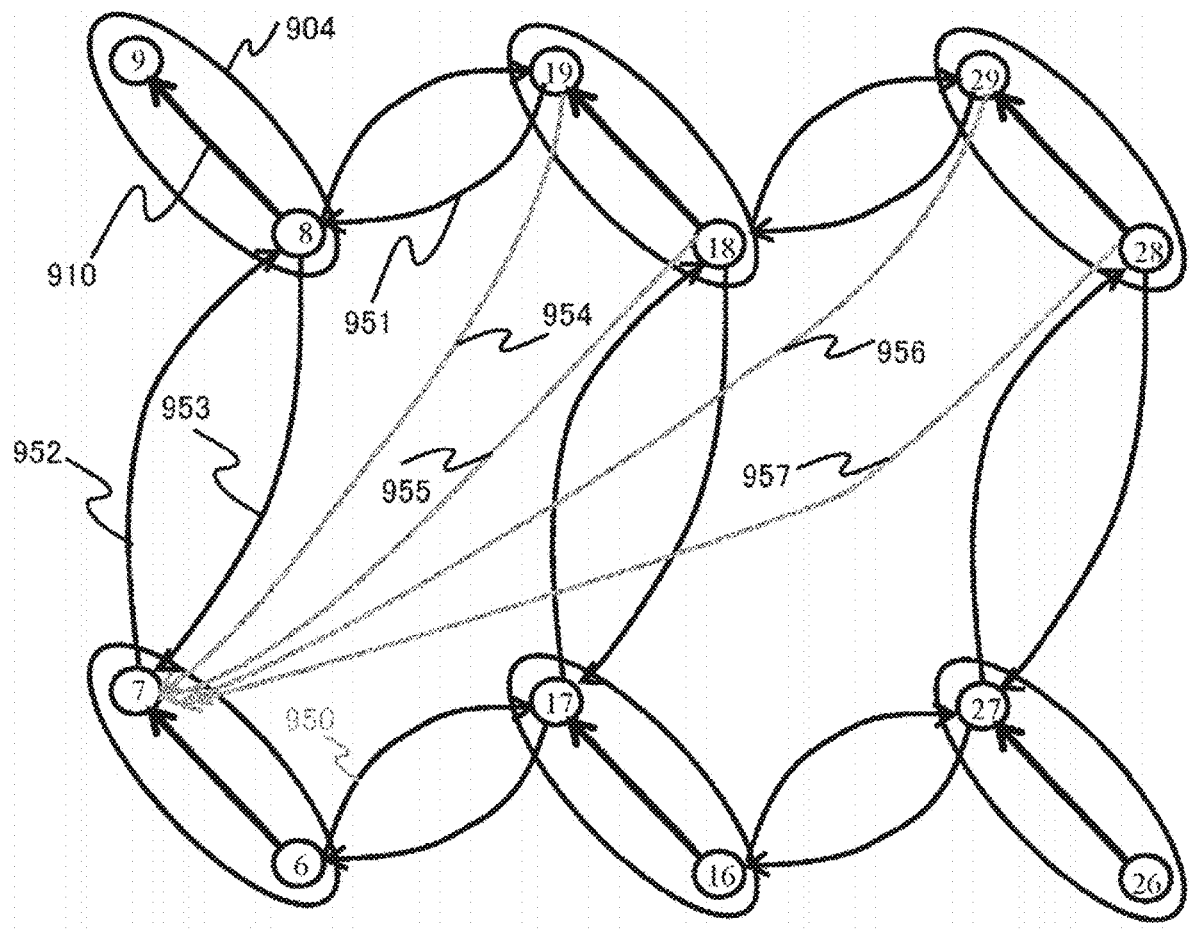

[Fig. 12]
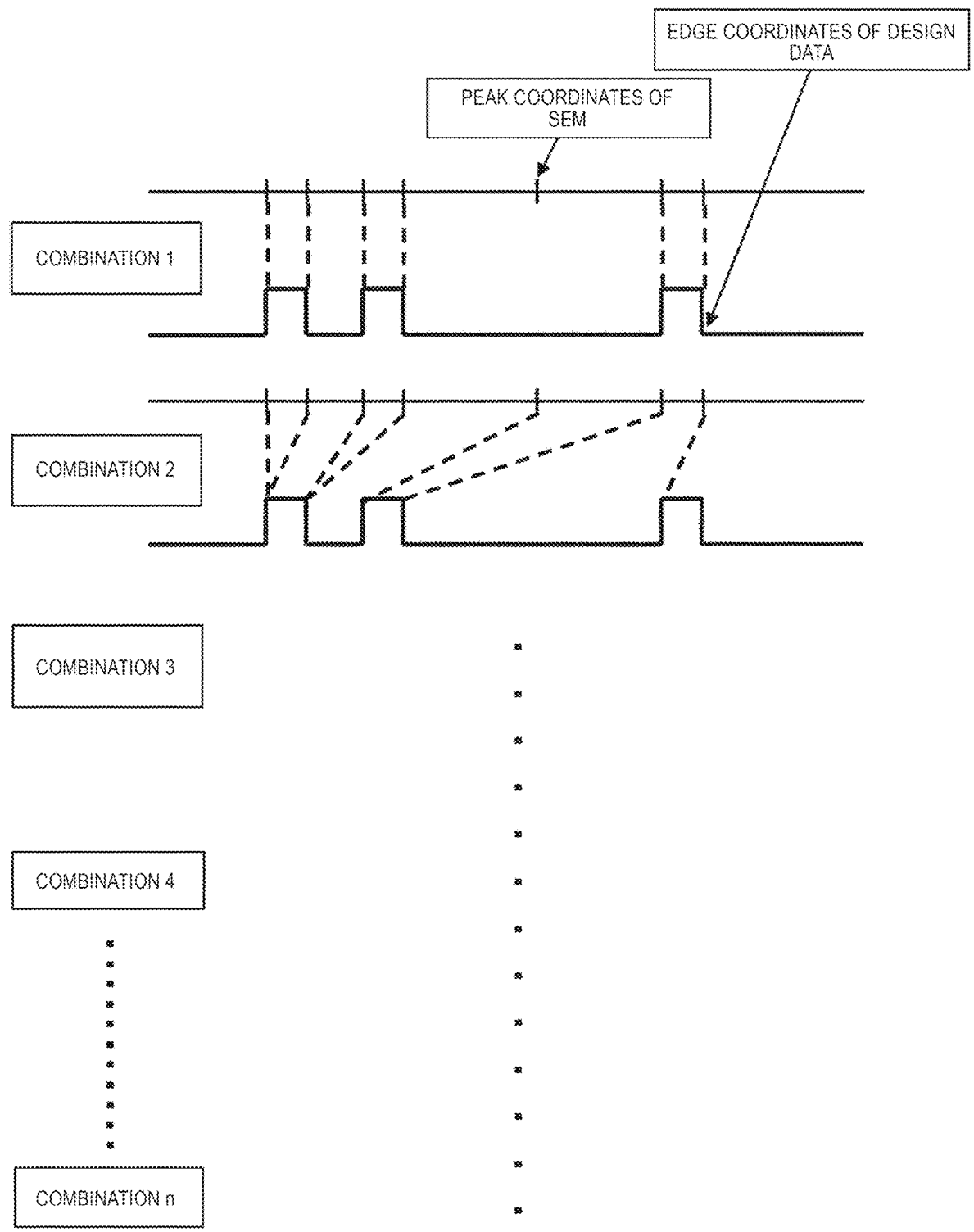

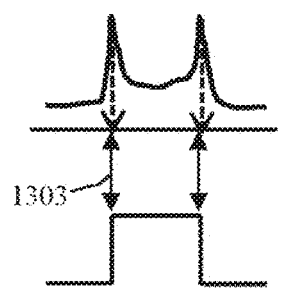
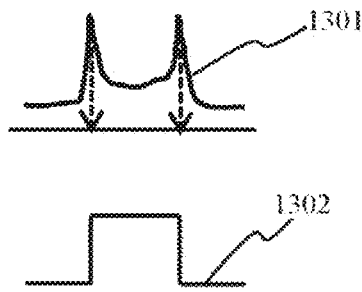
FIG. 13A  FIG. 13B
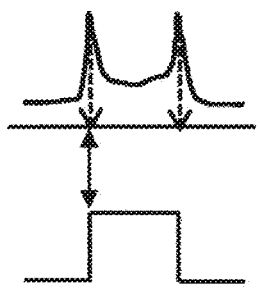 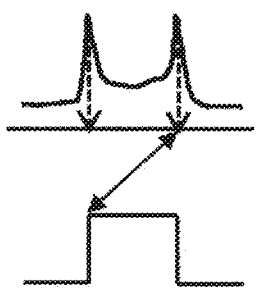 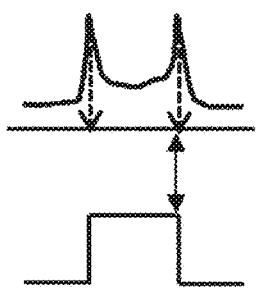 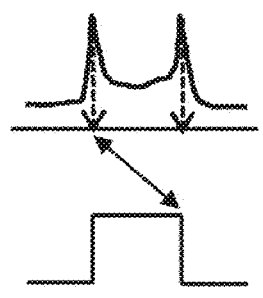
FIG. 13C  FIG. 13D  FIG. 13E  FIG. 13F
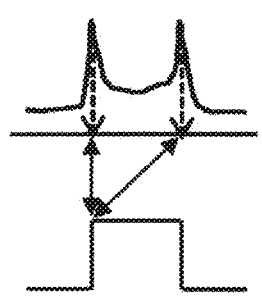 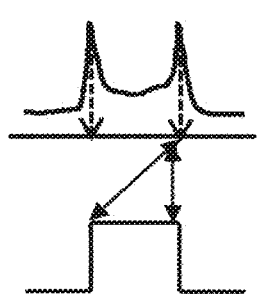 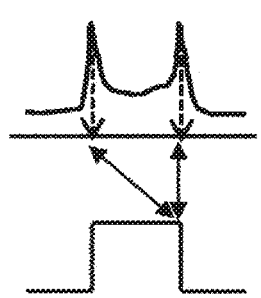 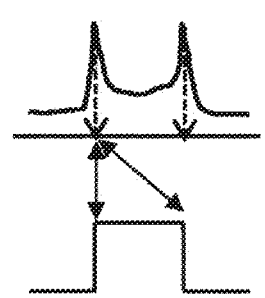
FIG. 13G  FIG. 13H  FIG. 13I  FIG. 13J
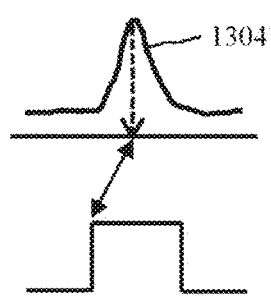 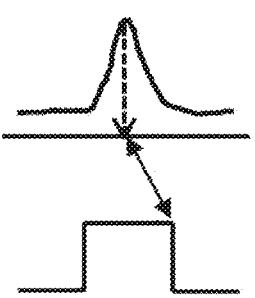 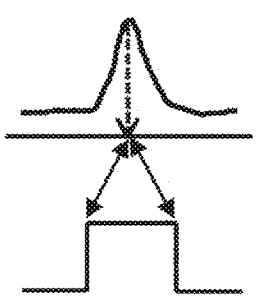 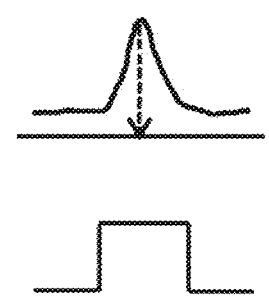
FIG. 13K  FIG. 13L  FIG. 13M  FIG. 13N

PATTERN MATCHING DEVICE AND COMPUTER PROGRAM FOR PATTERN MATCHING

TECHNICAL FIELD

The present invention relates to a pattern matching device and a computer program for pattern matching, and more particularly to a pattern matching device that realizes highly accurate matching processing regardless of a change in an edge position of a pattern or a signal waveform, and a computer program.

BACKGROUND ART

In a device that measures and inspects a pattern formed on a semiconductor wafer, there have been many cases where desired measurement or alignment of a visual field of an inspection device with a measurement position is performed using a template matching technique. PTL 1 discloses an example of such a template matching method. Meanwhile, template matching is a process of detecting a region most conforming to a template image registered in advance from an image to be searched for.

In addition, PTL 2 discloses a method of creating a template for template matching on the basis of design data of a semiconductor device. When the template can be created on the basis of the design data, there is an advantage in that the labor of purposely acquiring an image by an inspection device for creating the template is required (meanwhile, it is also possible to set an image to be searched for to be design data and to set the template to be an image acquired by the inspection device).

CITATION LIST

Patent Literature

PTL 1: Japanese Patent No. 4218171 (corresponding to U.S. Pat. No. 6,627,888)
PTL 2: Japanese Patent No. 4199939 (corresponding to U.S. Pat. No. 7,235,782)

SUMMARY OF INVENTION

Technical Problem

Incidentally, in template matching, the matching may fail in a case where there is a great apparent divergence of an image between a template and an image to be searched for. Examples of the reason for the great apparent divergence between the template and the image to be searched for include a case where there is a great difference between an imaging condition of an inspection device at the time of registering the template and an imaging condition of the inspection device at the time of capturing the image to be searched for, a case where there is a great difference between the performance of a semiconductor pattern captured at the time of registering the template and the performance of the semiconductor pattern at the time of capturing the image to be searched for, a case where there is a difference between a process of manufacturing the semiconductor pattern at the time of registering the template and a process of manufacturing the semiconductor pattern at the time of capturing the image to be searched for (may be performed in order to divert a template image created in another process and to reduce the number of processes of template registration), and the like.

In a case where the measurement or inspection of a pattern is performed using a scanning electron microscope (SEM) which is a type of measurement and inspection device, a waveform signal is generated on the basis of the detection of electrons discharged from a wafer, and the measurement of a dimension between peaks of the waveform signal, and the like are performed. However, a pattern becomes finer as a semiconductor device is further highly integrated, and thus there is a possibility that the number of peaks of the signal waveform changes.

In a case where there is a great divergence between a template registered in advance or an assumed waveform signal and an image or waveform signal which is actually acquired, there is a possibility that appropriate template matching cannot be performed, and thus there is a possibility that measurement or inspection after the matching processing is affected. PTL 2 discloses that a template close to a pattern of a real image is created by performing smoothing processing on figure data generated on the basis of design data and performing processing for rounding a corner portion of the pattern. However, it is difficult to cope with a change in the position of an edge or the number of edges. PTL 1 does not also disclose a method of performing matching processing on an image in which the position of an edge or the number of edges is not determined.

Hereinafter, a pattern matching device capable of performing highly accurate positioning even when there is a change in the position of an edge or the number of edges, and a computer program are proposed.

Solution to Problem

According to aspect for accomplishing the above-described object, there are provided a pattern matching device and a computer program, the pattern matching device including a calculation processing device that executes pattern matching by using design data or pattern data formed on the basis of captured image, in which the calculation processing device associates a plurality of edges included in a first pattern data and a plurality of edges included in a second pattern data with each other between the first pattern data to be matched and the second pattern data to be matched with the first pattern data, prepares a plurality of different association combinations, evaluates the plurality of association combinations by using index values regarding the plurality of edges, and executes matching processing using the association combination selected through the evaluation.

Advantageous Effects of Invention

According to the above-described configuration, it is possible to highly accurate alignment even when there is a change in the position of an edge or the number of edges during pattern matching processing.

BRIEF DESCRIPTION OF DRAWINGS

FIG. 1 is a block diagram illustrating a process of searching for an appropriate association between edge information obtained from an SEM image and edge information of design data.

FIG. 4 is a diagram illustrating an example of a measurement device that associates an SEM image and design data with each other.

FIG. 8 is a diagram illustrating a semiconductor measurement system including a scanning electron microscope and a pattern matching device that executes pattern matching on an image obtained by the scanning electron microscope.

FIG. 11 is a diagram illustrating association processing of edge points used for association between an SEM image and design data.

FIG. 12 is a diagram illustrating types of association combinations of a plurality of edges of an SEM image and a plurality of edges of design data.

FIGS. 13A-N are diagrams illustrating types of association between one pattern edge of design data and an edge of an SEM image.

DESCRIPTION OF EMBODIMENTS

Figure 2A:
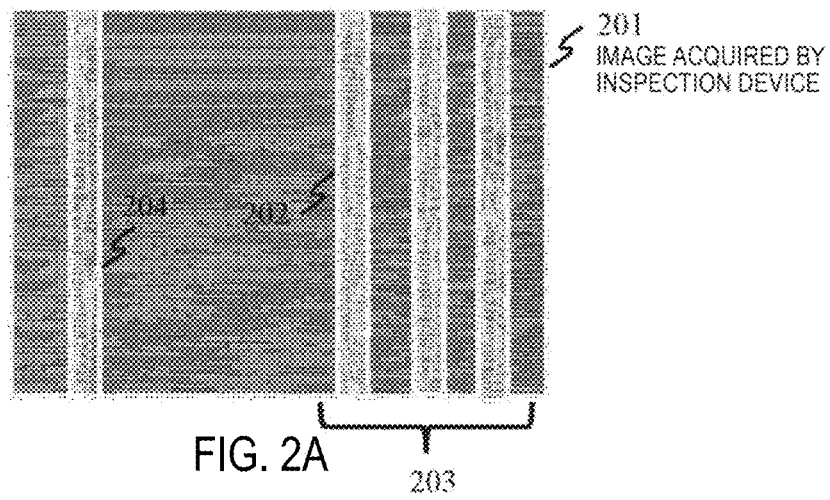
FIGS. 2A-C are diagrams illustrating association between an SEM image and design data.

As an example of a device that executes template matching processing, a scanning electron microscope is known. Pattern matching processing is mainly performed to specify a location where the measurement or inspection of a semiconductor device or the like is performed. In such a device that performs measurement and inspection, a visual field of a device is moved to a rough position of a measurement position by the movement of a stage. However, in many cases, a great degree of shift occurs on an image which is captured with a high magnification of the electron microscope with only the accuracy of positioning of the stage. In addition, a wafer is not limited to being mounted on the stage in the same direction each time, and a coordinate system (for example, a direction in which chips or the like of the wafer are lined up) of the wafer mounted on the stage does not complete conform to a driving direction of the stage, which also causes a shift on the image captured with a high magnification of the electron microscope.

Further, in order to obtain an electron microscope image having a high magnification by a desired observation position, a target position on an observation sample may be irradiated with electron beams by deflecting a minimum amount of electron beams (for example, equal to or less than several tens of μm) (may be referred to as a beam shift). However, an irradiation position may also be shifted from the desired observation position only with the accuracy of deflection control of the beams in the beam shift. Template matching is performed in order to perform measurement and inspection at an accurate position by correcting such respective shifts.

Specifically, alignment is performed in multiple stages by performing alignment in an optical camera having a magnification lower than that of an electron microscope image and performing alignment in the electron microscope image. For example, in a case where the alignment of the coordinate system of the wafer mounted on the stage is performed by the optical camera, alignment is performed using an image of a plurality of chips (for example, chips at the right and left ends of the wafer) which are positioned so as to be spaced apart from each other on the wafer. First, the same unique patterns located inside the respective chips or in the vicinity thereof (patterns located at relatively the same position inside the respective chips) are registered as templates. Next, the stage is moved so as to capture images of the patterns registered as templates in the respective chips, thereby acquiring images in the respective chips. Template matching is performed on the acquired images. As a result, the amount of shift of tale stage movement calculated on the basis of the obtained matching positions, and the coordinate system of the stage movement and the coordinate system of the wafer are matched to each other by using the amount of shift as a correction value of the movement of the stage.

In addition, in alignment to be subsequently performed by the electron microscope, a unique pattern close to a measurement position is registered as a template in advance, and relative coordinates or the measurement position seen from the template are stored. When the measurement position is obtained from an image captured the electron microscope, template matching is performed in the captured image to determine a matching position, and a location moved from the matching position by the relative coordinates is set to be the measurement position. The visual field of the device is moved to a desired measurement position by using such template matching (referred to as alignment of inspection and measurement positions). Finally, a measurement target which is set in advance is searched for within the visual field by the template matching at the measurement position. A measurement process (for example, the measurement of a pattern dimension, or the like) which is set in advance is performed on the searched measurement target.

With recent miniaturization of a semiconductor pattern, a divergence in a shape between a semiconductor pattern imaged at the time of registering a template and a semiconductor pattern obtained by capturing an image to be searched for has been increased (a divergence is relatively large with respect to the size of a pattern in design data). For example, the patterning of a device based on a multiple exposure method (a self aligned double patterning (SADP) technique, a self aligned quadruple patterning (SAQP) technique, or the like) which is used as a miniaturization technique is likely to cause a divergence in a shape (a divergence in positions of each pattern) due to a shift of an exposure position of each design data layer, and a divergence in a shape is likely to occur due to conditions of a reaction of organization even in the patterning of a device based on a method using a self-organizing material such as directed self assembly (DSA) technique.

Since patterning is performed at the stage of development of a device under various condition in order to search for many manufacturing conditions allowing more stable patterning, and thus a divergence in a shape occurs originally. In addition, in a method of creating the above-described template for template matching on the basis of design data of a semiconductor device, the template is based on the design data instead of an image obtained by capturing a real semiconductor device, and thus a divergence in a shape occurs. In this case, a divergence in a shape (the position of an edge) is often increased as compared to a case where the image obtained by capturing the real semiconductor device is used for the template. The invention is not limited to this example, and an apparent divergence in an image between a template and an image to be searched or may be increased due to various causes.

An example to be described below relates to a pattern matching device capable of measuring and inspecting a semiconductor device even when a divergence in the shape of a pattern is great, and a computer program. Here, a specific example of a divergence will be described with reference to FIGS. 2 and 3. Meanwhile, this example illustrates a case where the above-described design data is used, and shows an image (design data image) which is obtained by generating an image to be searched for on the basis of the design data and an image (device acquisition image) which is obtained by acquiring a template by an inspection device.

Figure 2B:
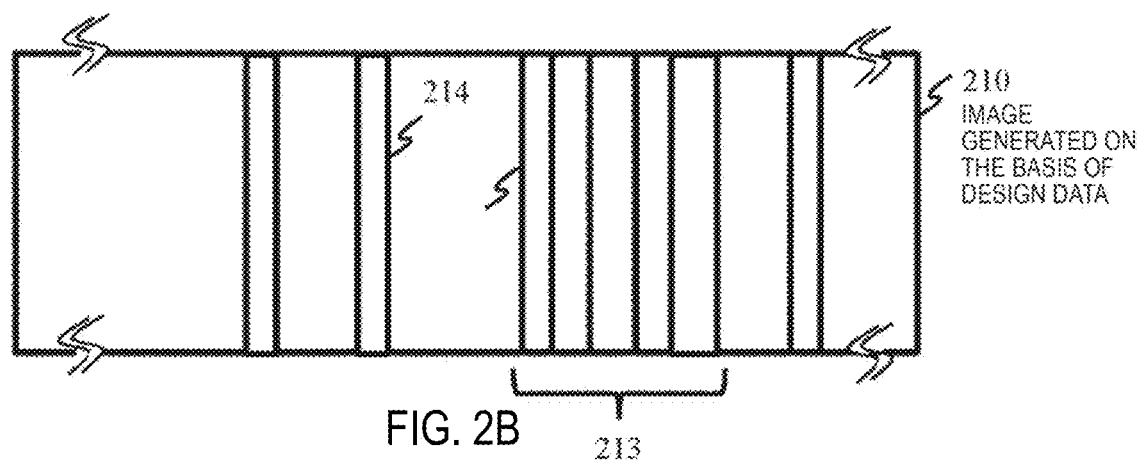
Figure 2C:
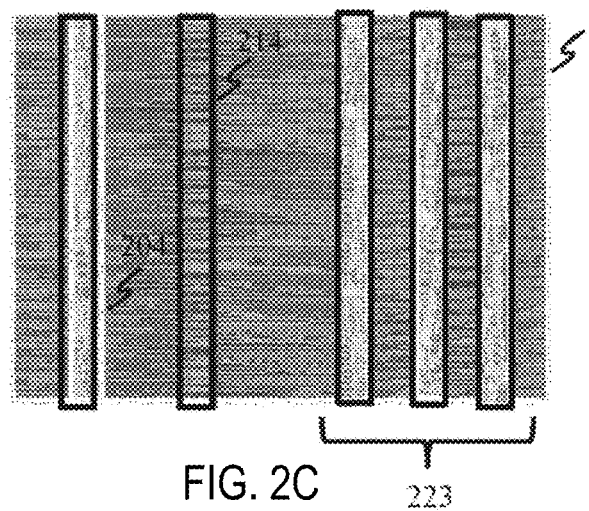

In particular, an example where only a pattern 202 having a linear shape is within a visual field is illustrated in FIG. 2(a). In the linear shape, the amount of information is small due to only one-dimensional pattern, and thus there are many cases where it becomes difficult to perform collation processing such as template matching. In FIG. 2, FIG. 2(a) illustrates the device acquisition image 201, FIG. 2(b) illustrates a design data image 210, and FIG. 2(c) illustrates an example of a result of collation between both the images (described by superimposing both the images on each other at a collation position). Next, a description will be given in more detail, and FIG. 2(c) illustrates an example of a failure in collation. A region 203 in which three lines are lined up in the device acquisition image 201 of FIG. 2(a) and a region 213 in which three lines are lined up in the design data image of FIG. 2(b) are correctly collated with each other in a region 223 in which three lines are lined up in FIG. 2(c). However, a line 204 separated on the left side of the three lines lined up in FIG. 2(a) corresponds to a line 214 in FIG. 2(b). However, in FIG. 2(c), both the lines (the line 204 and the line 214) are not correctly collated with each other (not associated with each other). That is, collation is correctly performed in a portion within the visual field (in this example, a portion which three lines are lined), but collation is not correctly performed in the other portions (the line 204 and the line 214).

Such a failure in collation is caused by the occurrence of a divergence in the arrangement of patterns (positions of the respective patterns) between the template and the image to be searched for. Here, such a situation is referred to as a "non-uniform arrangement shift" of a pattern. Since it is premised that an object is substantially a rigid body in the above-described template matching method, it is basically impossible to correctly perform collation on all patterns within a visual field in a case such as FIG. 2(c).

In an example described below, a description will be given of a method of correctly performing collation even when such a "non-uniform arrangement shift" occurs.

FIG. 3 is a diagram illustrating a case (also including the case illustrated in FIG. 2) where it is difficult to perform collation of edges. First, FIG. 3(a) illustrates an example where collation (association) is correctly performed in a difficult case as illustrated in FIG. 2. A result of association between positions of patterns of the device acquisition image 201 and the design data image is indicated by dashed lines 301 between both the images. Hereinafter, end points (referred to as edges) of the patterns, associated with each other in this manner, which are connected to each other by the dashed lines will be described.

Figure 3A:
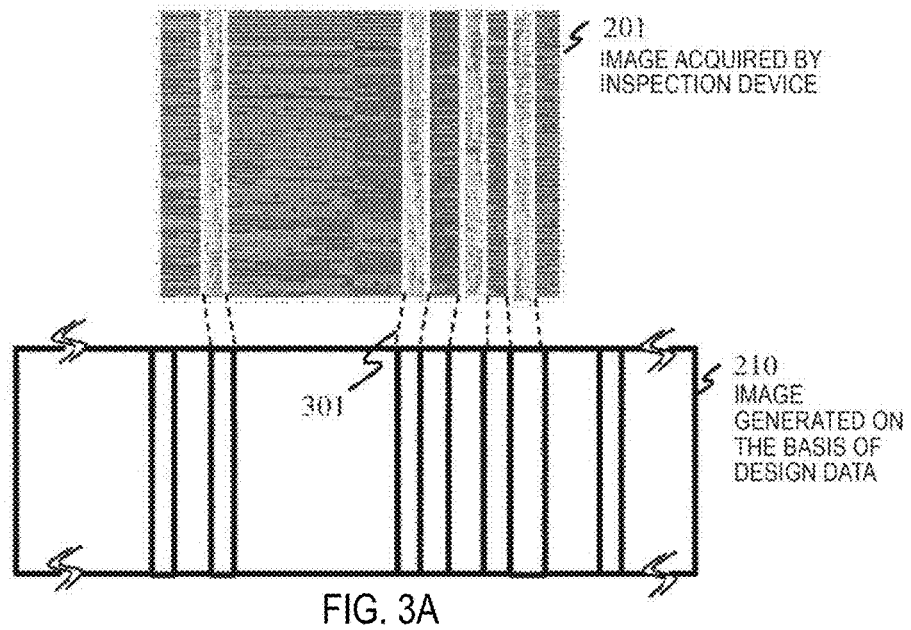
FIGS. 3A-F are diagrams illustrating types of association when association is performed between an edge of an SEM image and an edge of design data.
Figure 3B:
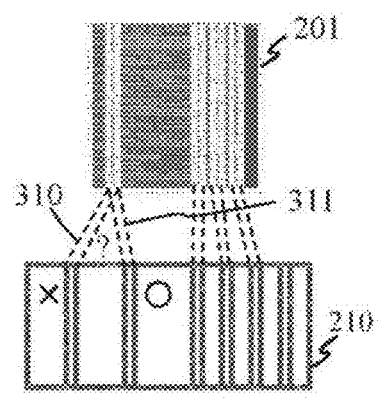

FIG. 3(b) illustrates an example of a "non-uniform arrangement shift". Although two association candidates (310 and 311) are shown, the device acquisition image is an example in which a pattern interval between three line patterns lined up and one line pattern is widened, and association 311 is correctly performed.

Figure 3C:
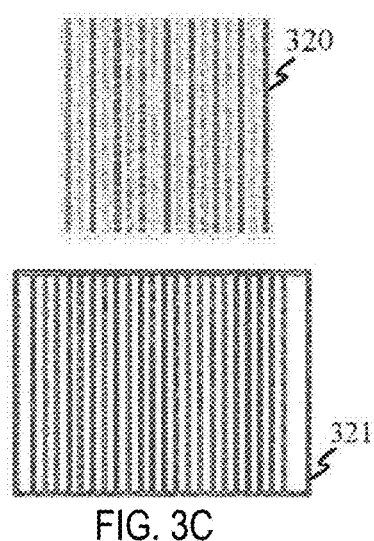

FIG. 3(c) illustrates an example in which a ratio of an interval between lines to an interval between spaces therebetween (hereinafter, referred to as spaces) is approximately 1:1. In a device acquisition image 320, the line and the space are indistinguishable because there is little apparent difference therebetween. Alternatively, there are many cases where it is not possible to distinguish between the line and the space in spite of there being an apparent difference between the line and the space (for example, in a case of an electron microscope, in general, a space portion becomes dark and the space portion becomes bright. However, light and dark are reversed depending on a material, and it is difficult to determine the space and the line with information of light and dark). In this case, it is difficult to perform association even when the line and the space are known in the design data image.

Figure 3D:
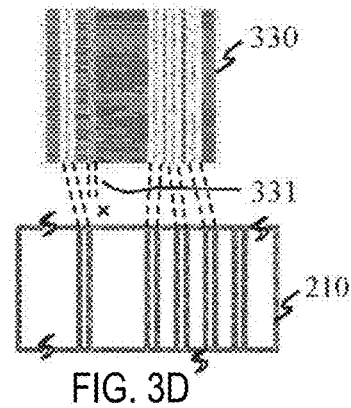

FIG. 3(d) illustrates an example in which a pseudo edge 331, which is not the edge of a pattern, is reflected in a device acquisition image 330. This is caused by, for example, dirt on the surface of a sample, the unevenness of the surface of the sample, or the like. In this case, it is correct that an edge 331 is not associated with the edge of the design data image 210. When there is an attempt to execute template matching accompanied by association between edges under the following situation, surplus edges exert a bad influence, and thus there are many cases where it is difficult to perform collation.

Figure 3F:
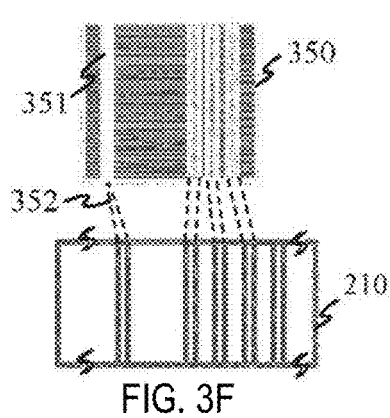
Figure 3E:
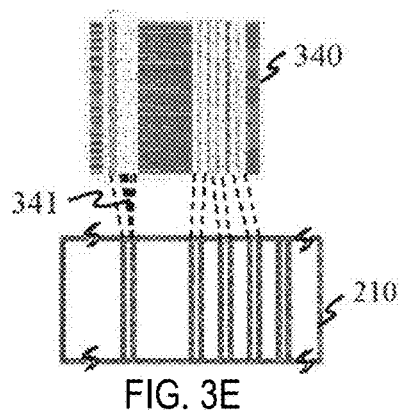

FIG. 3(e) illustrates a case where a side wall portion is reflected on an image, and a plurality of edges 341 are generated in the side wall portion in a case where a side wall of a line pattern is inclined without being perpendicular to the ground surface of a sample in a device acquisition image 340, or the like. In this case, as illustrated in FIG. 3(e), it is correct to associate the edges of the side wall portion with one edge in a design data image. When it is premised that an object is a rigid body in consideration of template matching accompanied by association between the edges, it is difficult to collate the plurality of edges with one edge.

FIG. 3(f) illustrates a case where the right and left ends of a line is seen as one edge in an image of the line because a line pattern 351 is minute in a device acquisition image 350. In a design data image corresponding to the edge, two edges at the right and left ends of the line pattern are present, and thus it is correct to set two edges in the design data image to be association 352 of one edge in the device acquisition image. In a case where a line pattern being seen as one edge (single peak) and a line pattern being seen as two edges (referred to as a double peak) are mixed as in the device acquisition image 350, there are many cases where it is difficult to discriminate between both the line patterns and to perform collation therebetween when there is an attempt to examine the adoption of template matching accompanied by association between edges.

In the above-described cases illustrated in FIGS. 3(b) 3(c), 3(d), 3(e), and 3(f), it is difficult to associate the device acquisition image and the design data image with each other. In an example to be described below, means for allowing association between a device acquisition image and a design data image is provided inclusive of such cases.

A device performing the inspection or measurement of a semiconductor pattern formed on a wafer in this example associates a pattern edge in an SEM image and a pattern edge in design data with each other from association candidates by discretization optimization processing by using means for selecting a pattern edge candidate from the SEM image, means for selecting a plurality of candidates of association between the pattern edge candidate and the pattern edge of the semiconductor design data, means for calculating an evaluation value related to a relative positional shift between the pattern edge in the SEM image and the pattern edge in the design data in the associated candidates, means for calculating an evaluation value related to the degree of conformity regarding the ascent and descent between the pattern edge in the SEM image and the pattern edge in the design data in the associated candidates, means for calculating an evaluation value related to the edge in of the pattern edge in the SEM image in the associated candidates, the evaluation value related to the relative positional shift, the evaluation value related to the degree of conformity regarding the ascent and descent, and the evaluation value related to the edge intensity, in the association between the pattern edge in the SEM image and the pattern edge in the design data.

According to the above-described configuration, it is possible to associate the device acquisition image and the design data image with each other as illustrated in FIG. 3(a). It is possible to perform association also in a case where the "non-uniform arrangement shift" illustrated in FIG. 3(b) occurs and cases as illustrated in FIGS. 3(c), 3(d), 3(e), and 3(f). Thereby, it is possible to robustly perform the alignment of the above-described inspection and measurement positions and the measurement of a desired object to be measured even by template matching based on association between edges.

Hereinafter, a template matching device and a computer program will be described with reference to the accompanying drawings. Meanwhile, components having the same reference numerals and signs in the drawings denote the same members as long as there is no particular excuse.

FIG. 1 is a block diagram illustrating a calculation processing device that executes template matching processing and illustrating a flow of a process of associating an edge in a device acquisition image acquired by an SEM or the like and an edge in a design data image with each other. In this example, a scanning electron microscope (SEM) mainly used for the measurement of a dimension of a pattern of a semiconductor device which is formed on a semiconductor wafer is described as an example of a measurement device (this device will be described in FIG. 4). Hereinafter, an image acquired by the SEM may also be referred to as an SEM image. In this example, correct edge (true edge) information in the SEM image and association information 103 between the true edge and the design data are output by using an SEM image 101 and design data 102 as inputs. In order to obtain an appropriate association, all association combinations (association candidates) of an edge candidate 105 and an edge in the design data are obtained, and the likelihood (may also be expressed by a cost) of association in each association candidate is further obtained, thereby obtaining an appropriate association by discretization optimization processing.

First, as processing for the SEM image 101, an edge candidate selection unit 104 selects an edge candidate 105 from the SEM image. In this processing, it is not necessary to select only a true edge, and many edge candidates of an edge are selected inclusive of erroneous edge candidates.

The erroneous edge candidates are removed by an association processing unit 114 in post-stage processing in this block diagram, and thus the erroneous edge candidates may be included. As a method of extracting the edge candidate from the SEM image, for example, differential processing (for example, secondary differential processing) is performed on a profile (referred to as a line profile) which is generated by performing average projection on the SEM image in the longitudinal direction of a line pattern, an edge candidate having a high intensity (edge candidate having a value equal to or greater than a certain threshold value) is selected (or a zero-cross point is selected by the secondary differential processing). Alternatively, in the line profile, a position having a maximum value is selected in front and rear pixels. A process of selecting an edge candidate is not limited thereto, and may be a process of extracting the end (edge) of a pattern.

Meanwhile, noise reduction processing may be added to the line profile in advance to reduce the extraction of erroneous edges due to the influence of noise. Examples of the noise reduction processing include moving average processing, Gaussian filtering, and the like. However, the invention is not limited thereto as long as the noise reduction processing is processing for reducing noise. Since the line profile of the SEM image has high noise, the noise reduction processing is effective in reducing an unnecessary erroneous edge candidate. As described above, the edge candidate selection unit 104 selects the edge candidate 105.

Next, as processing for the design data 102, a cut-out processing unit in the vicinity of an object to be associated cuts out the design data. There are many cases where design data of a semiconductor pattern has a large region size, and a region size (level of positioning accuracy of the above-described device) which is actually a candidate of association with the SEM image is particularly limited. Consequently, the design data is cut out, and a region of the design data which is unnecessary for association is excluded from a search range. Design data 107 which is cut out by this processing is obtained.

An association candidate selection unit 108 for the design data and the edge candidate selects an association candidate by using the edge candidate 105 from the SEM image and the cut-out design data 107 which are obtained above as inputs. In the selection of the association candidate, all combinations of the edge candidate 105 and an edge of the cut-out design data are basically obtained. Details of the selection of the combinations will be described in FIG. 5. An edge intensity information calculation unit 109 in each edge candidate obtains an edge intensity 111 of each edge candidate from the line profile of the SEM image as one of indexes for selecting a true edge candidate in optimization processing at the subsequent stage. In general, as an edge becomes close to a true edge, the edge is clear, and thus the intensity of the edge is increased. On the other hand, regarding a pseudo edge and the like, the edge is blurred, and thus the intensity of the edge is low in many cases (the intensity may be reversed in the true edge and the pseudo edge. However, in this case, it is possible to correctly perform association by using other index values to be described later).

A method of calculating the intensity of an edge uses, for example, a difference between the minimum signal intensity of the line profile and a signal intensity at the position of the edge candidate, or a difference between a value of an inclination (differential value) in the vicinity of the edge candidate in the line profile or a minimum value (local minimum value) of a signal intensity in the vicinity of the edge candidate in the line profile and signal intensity of the edge candidate. The method of calculating the intensity of an edge is not limited thereto, and the end (edge) of a pattern which outputs a high index value (edge intensity information) may be used in the SEM image.

A mutual information calculation unit 110 for the design data and the edge candidate calculates an index value (mutual information) which is obtained for each association candidate from both the design data and the edge candidate in order to select an appropriate association in optimization processing at the subsequent stage, unlike a case of calculation from only the profile of the SEM image in the above-described edge intensity 111. Details thereof will be described in FIGS. 6 and 7, an ascent and descent conformity degree 112 of a pattern and a pattern relative positional shift amount 113 in each association candidate are obtained. Here, regarding the ascent and descent conformity degree and the relative positional shift amount, an index value in each of associations between the edge in the SEM image and the design data image, which is included for each association candidate, is obtained (equivalent to the obtainment of an index value for each dashed line in FIG. 3(a)).

The association processing unit 114 for edge points selects an appropriate association by discretization optimization processing (details will be described in FIG. 9) by roughly using three index values (the edge intensity information 111, the ascent and descent conformity degree information 112, and the pattern relative positional shift amount information 113) as inputs. When the result of the appropriate association is obtained, association (equivalent to each dashed line illustrated in FIG. 3(a)) between a true edge and design data is obtained. In addition, the position (equivalent to a starting point of each dashed line illustrated in FIG. 3(a) on the SEM image side) of the true edge is also known from the edge point of the SEM image which is adopted for the association. As described above, it is possible to perform association as indicated by the dashed line in FIG. 3(a) and to perform association even when a positional error occurs between the edge of the design data and the edge of the SEM image as illustrated in FIGS. 3(b), 3(c), 3(d), and 3(e).

It is also possible to perform the alignment of measurement and inspection positions from results of the association. For example, the amount of relative positional shift (distance) between the SEM image and the design data for minimizing the sum (or square sums) of positional shifts in the respective associations is obtained, and can be set to be the amount of alignment shift which is used for the above-described alignment. That is, it is possible to perform highly accurate matching processing by alignment for narrowing both the shifts.

A method of obtaining the amount of alignment shift amount of alignment shift (distance) is not limited thereto, and may be a method of obtaining the amount of relative shift (distance) between the SEM image and the design data. In addition, in the measurement of a desired object to be measured, when association is completed, it is possible to select an object to be measured which is a device acquisition image equivalent to an object to be measured which is simply set by the design data on the basis of an association result. Then, desired measurement (for example, the measurement of a dimension, or the like) may be performed. As described above, it can be understood that it possible to perform the alignment of measurement and inspection positions or the measurement of a desired object to be measured even when the object has a difficulty in template matching of the related art.

FIG. 4 illustrates a scanning electron microscope which is mainly used for the measurement of a dimension of a pattern of a semiconductor device which is formed on a semiconductor wafer, and is a configuration diagram of the device when association performed. In the SEM, an electron beam is generated from an electron gun 401. A deflector 404 and an object lens 405 are controlled so that any position on a semiconductor wafer 403 which is a sample mounted on a stage 402 is irradiated with an electron beam being in focus. Secondary electrons are discharged from the semiconductor wafer 403 irradiated with the electron beam, and are detected by a secondary electron detector 406. The detected secondary electrons are converted digital signal by an A/D converter 407 and are stored in an image memory 415 within a processing and control unit 414, and a CPU 216 performs image processing corresponding to a purpose and identification processing using machine learning.

Association to be described below is performed by the processing and control unit 414. The setting of processing and the display of a processing result are performed by a display device 420. In addition, in alignment using an optical camera having a magnification lower than that of the above-described electron microscope, an optical camera 411 is used. A signal obtained by imaging the semiconductor wafer 403 by this camera is also converted into a digital signal by an A/D converter 412 (in a case where a signal from the optical camera is a digital signal, the A/D converter 412 is not necessary) and is stored in the image memory 415 within the processing and control unit 414, and a CPU 416 performs image processing corresponding to a purpose.

In addition, in a case where a reflected electron detector 408 is provided, reflected electrons discharged from the semiconductor wafer are detected by a reflected electron detector 408, and are converted into a digital signal by an A/D converter 409 or 410. The signal is stored in the image memory 415 within the processing and control unit 414, and the CPU 416 performs image processing corresponding to a purpose. In this example, the scanning electron microscope is described as an example of an inspection device. However, the invention is not limited thereto, and the scanning electron microscope can be applied to a measurement device that acquires an image and performs template matching processing, and an inspection device.

FIG. 8 is a diagram illustrating an example of a pattern measurement system including a recipe creating unit 811 that sets conditions of a template, a matching processing unit 812 that executes pattern matching processing on the basis of the set template, and a calculation processing device 804 (pattern matching device) including a pattern measurement unit 810 that executes a process of measuring a measurement position which is specified by the matching processing unit 812.

The system illustrated in FIG. 8 is provided with a SEM main body 801, a control device 802 of the SEM main body, a design data storage medium 805 that stores design data, and an input device 806 that inputs information necessary for the calculation processing device 804, in addition to the calculation processing device 804. Secondary electrons obtained by scanning with an electron beam, and the like are captured by a detector 803, and are transmitted to the calculation processing device 804 as an image to be searched for of the matching processing unit 812 and a signal for measurement performed by a pattern measurement unit 810. Meanwhile, in this example, a description is given on the assumption that the control device 802 and the calculation processing device 804 are separate bodies, but the devices may be an integrated control device.

A signal based on the electrons captured by the detector 803 is converted into a digital signal by an A/D converter built into the control device 802. Image processing corresponding to a purpose is performed by image processing hardware such as a CPU, an ASIC, or an FPGA built into the calculation processing device 803.

The recipe creating unit 811, the matching processing unit 812, and the pattern measurement unit 810 are built into the calculation processing unit 807 as described above. A cut-out unit 106 is as described with reference to FIG. 1, and performs a process of cutting out a portion of design data read out from the design data storage medium 805 on the basis of pattern identification data such as coordinate information which is set from the input device 806. In addition, the recipe creating unit 811 creates pattern data provided for matching, on the basis of the cut-out design data (layout data).

Processing within the matching processing unit 812 is as described with reference to FIG. 1, and a matching processing unit 809 executes matching processing by using a selected association combination to be described later. A memory 808 stores design data, recipe information, image information, measurement results, and the like.

Meanwhile, it is also possible to perform processing and control by allocating some or all of control and processes in the calculation processing device 804 to an electronic computer mounted with a CPU or a memory capable of storing images, or the like. In addition, the input device 806 also functions as an imaging recipe creating device that sets measurement conditions including coordinates of an electronic device necessary for measurement, inspection, and the like, the type of pattern, and imaging conditions (optical conditions or stage movement conditions) as an imaging recipe. In addition, an input device 2515 also has a function of collating the input coordinate information or information regarding the type of pattern with layer information of design data or identification information of the pattern, and reading out necessary information from the design data storage medium 805.

The design data stored in the design data storage medium 805 is represented in a GDS format, an OASIS format, or the like, and is stored in a predetermined format. In addition, the type of design data does not matter as long as software displaying the design data can display the format type thereof and the design data can be treated as figure data. In addition, the figure data may be line segment image information subjected to transformation processing for approximating to a real pattern by performing an exposure simulation, instead of line segment image information indicating an ideal shape of a pattern formed on the basis of the design data.

In addition, a program for performing processing to be described below may be registered in a storage medium and may be executed by a control processor that includes an image memory and supplies a necessary signal to the scanning electron microscope.

FIG. 5 is a diagram illustrating the association candidate calculation unit 108 for association between the design data and the edge candidate described in FIG. 1, and all combinations of the edge candidate 105 in the SEM image and the edge in the cut-out design data 107 described in FIG. 1.

Figure 5A:
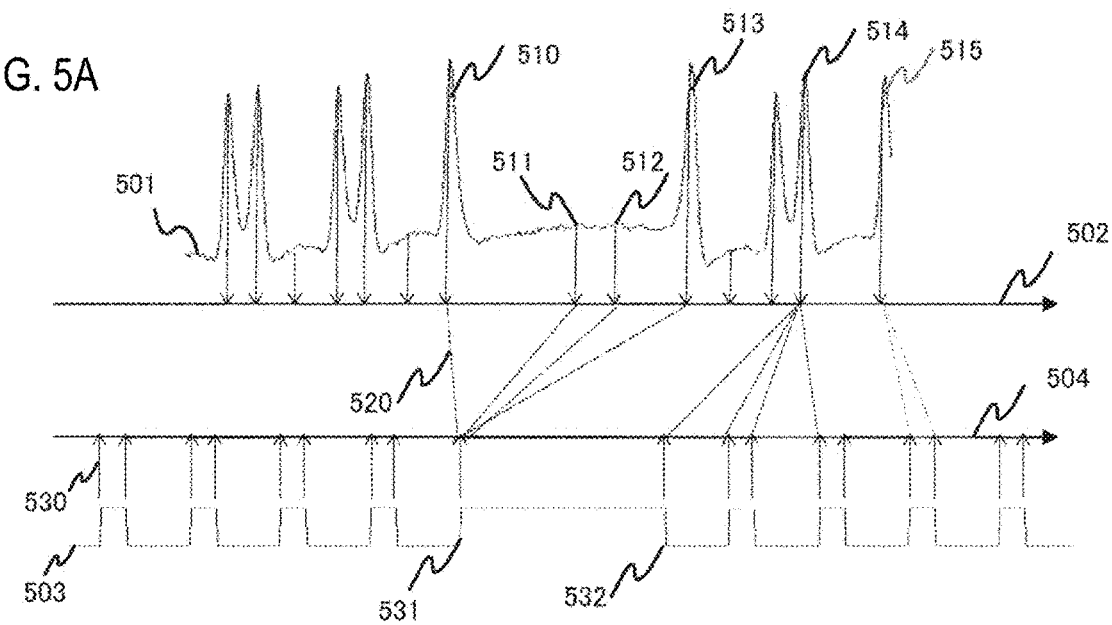
FIGS. 5A and 5B are diagrams illustrating a method of selecting a candidate in association between an SEM image and design data.

FIG. 5(a) illustrates an example of association between an edge candidate in an SEM image and design data. In this drawing, reference numeral 501 denotes a line profile generated by capturing the SEM image described in FIG. 1 (reference numeral 502 denotes an image coordinate axis directed in an imaging direction). In addition, reference numeral 503 denotes schematic irregularities of a pattern in a design data image (reference numeral 504 denotes an image coordinate axis equivalent to the same direction as that of reference numeral 502). For example, a portion projecting upward is a line, and a portion projecting downward is a space.

In the line profile 501, the edge candidate described in FIG. 1 is, for example, a portion indicated by a dashed line arrow 510. In this example, the number or edge candidates is 14 (the number of dashed line arrows). On the other hand, the edge in the design data image is, for example, the position of a dashed line arrow denoted by 530, and the number of edges is 18 in this example. Here, an edge candidate in the SEM image which corresponds to an edge 531 in the design data image is, for example, the edge 510 (association 520). In addition, associations with all of the other edge candidates are considered to be candidates (for example, edges 511, 512, and 513). The association candidates are obtained at all of the edge positions (18 edge positions in this example) of the design data image. All of the associations to be selected are obtained. These are referred to as all combinations of the edge candidate 105 and the edge in the cut-out design data 107.

Meanwhile, in the associations, it is also allowed that edge candidates (for example, edges 510, 511, 512, and 513) in a plurality of SEM images are associated with one edge (for example, the edge 531) in the design data image. Thereby, the association as described in FIG. 3(e) (a case where a plurality of edges are extracted at one pattern end) can also be expressed. In addition, it is also allowed that one edge candidate 514 in the SEM image is associated with a plurality of edges in the design data image. In particular, the association of an edge candidate 515 with two edges at the right and left ends in a projection portion in the design data leads to a case of a so-called single peak in which a line pattern serves as one edge. Thereby, the association (mixture of a single peak and a double peak) as described in FIG. 3(f) can also be expressed. Meanwhile, it is assumed that the replacement of the order of association is not allowed. For example, in a case where the edge 531 in the design data image and the edge candidate 513 in the SEM image are associated with each other, an edge 532 in the design data image is not associated with edge candidates (for example, the edge 512, 511, and 510, and the like) on the left side of the edge candidate 513. The replacement of this order hardly basically occurs in one-dimensional semiconductor pattern such as a line pattern, and thus has an effect of narrowing association candidates by adding this restriction and has an effect of improving robustness of association calculation by excluding unnatural association from solutions in discretization optimization processing at the subsequent stage. In addition, the number of association candidates is reduced, and thus there is also an effect of an increase in the speed of the discretization optimization processing. Meanwhile, in a case where the order may be replaced by a device manufacturing process or a case where an object is a two-dimensional pattern, this restriction may not be provided.

As described above, all combinations of the edge candidate 105 in the SEM image and the edge in the cut-out design data 107 are obtained. Thereby, it is possible to cause an optimal solution to be included in association candidates in optimization processing at the subsequent stage.

Figure 5B:
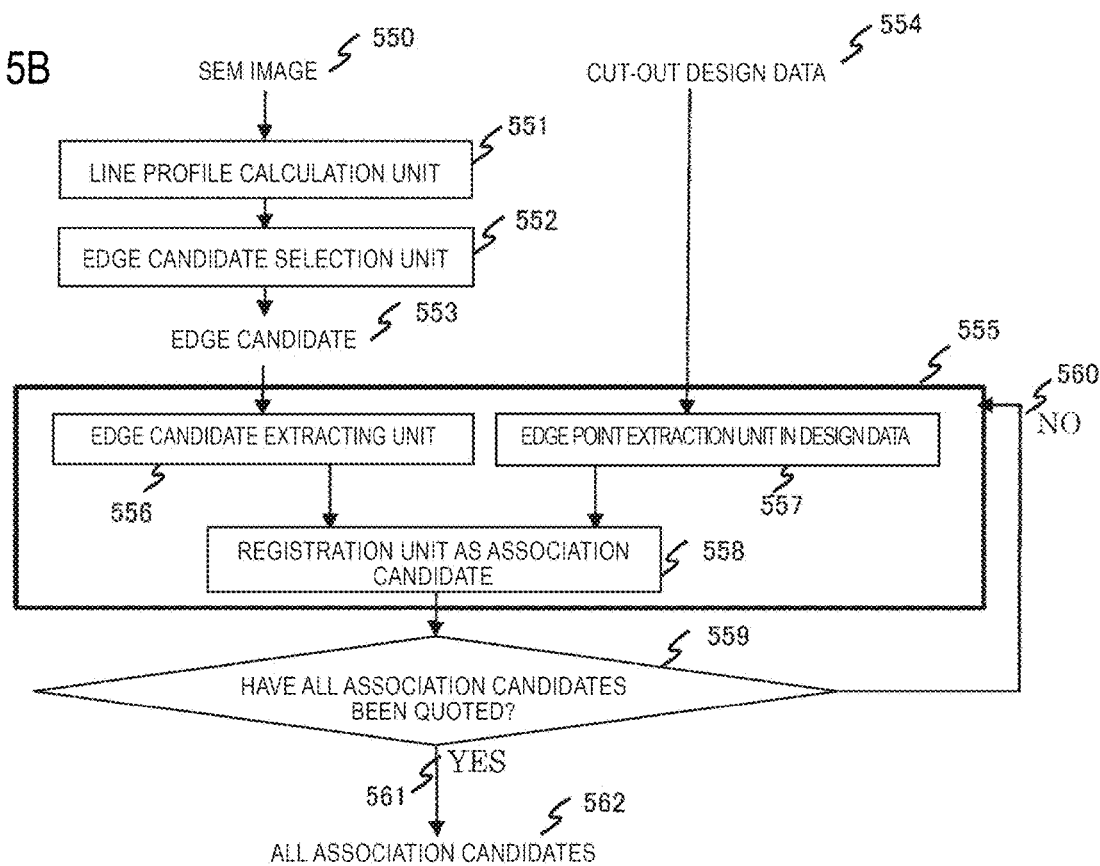

FIG. 5(b) is a block diagram illustrating the calculation of candidates of association between design data and an edge candidate. As described in FIG. 1, a line profile calculation unit 551 calculates a line profile from an SEM image, and an edge candidate calculation unit 552 calculates an edge candidate from the calculated line profile. Association candidates are obtained by using calculated edge candidates 553 and cut-out design data 554. An edge candidate extracting unit 556 extracts one edge candidate to be associated from the edge candidates 553. Similarly, an edge point extraction unit 557 in the design data extracts one edge to be associated from the design data 554. The extracted edge candidate of the SEM image and an edge point in the design data are registered as one association. It is determined whether or not all of the association candidates have been quoted (559), and the candidate calculation process is terminated when all of the candidates are quoted (561).

In a case where all of the candidates have not been quoted (560), an edge candidate is extracted again to perform a process of extracting an edge point in the design data. As described above, all combinations of the edge candidate in the SEM image and the edge in the cut-out design data are obtained, and thus it is possible to cause an optimal solution to be included in association candidates in optimization processing at the subsequent stage.

FIG. 12 a diagram illustrating types of association combinations of a plurality of edges of an SEM image and a plurality of edges of design data. In the processing of FIG. 5, a plurality of association combinations as illustrated in FIG. 12 are prepared and are set to be candidates for obtaining an optimal solution to be described later. FIG. 13 is a diagram illustrating types of associations between design data 1302 of one pattern having two edges and edge candidates of an adjacent SEM image. FIGS. 13(A) to 13(J) illustrate a case where a line pattern of the design data is configured as a double peak 1301, and FIGS. 13(K) to 13(N) illustrate a case where a line pattern of the design data is configured as a single peak 1304. In the examples of FIG. 13, association between edges of the SEM image and edges of the design data, which are not shown in the drawing, are not performed in order to facilitate understanding, but the number of associations is increased depending on the number of edge candidates.

FIG. 13(A) illustrates a case where an edge candidate of the SEM image and an edge candidate of the design data are associated with each other on a one-to-one basis (1303), which indicates a correct solution when a formed pattern is equal to the design data. However, a divergence may actually occur between the design data and the shape or position of a real pattern, and thus it cannot be said that FIG. 13(A) necessarily shows a correct solution. Further, FIG. 13(B) illustrates a case where association has not been made. This case shows a state where there is a deviation in the shape or position of a pattern edge. However, there also a possibility that an association combination including FIG. 13(B) is set to be a correct solution in a relationship with another association.

FIGS. 13(C) to 13(F) illustrate a case where one SEM edge candidate and one edge candidate of design data are associated with each other, and FIGS. 13(G) to 13(J) illustrate a case where a plurality of associations with one SEM edge candidate or one edge candidate of design data are made. A combination including such an association is also set to be an association combination candidate. Further, FIGS. 13(K) to 13(N) are diagrams illustrating types of associations in a case of a single peak. In performing such associations, line segments of the association are prevented from intersecting each other. More specifically, when the left peak and the right peak in the double peak 1301 are respectively associated with edges of the design data 1302, the selection of an edge candidate is performed such that an edge candidate of the design data which corresponds to the left peak is positioned on the left side of an edge candidate of the design data which corresponds to the right peak.

As in this example, a plurality of association combinations are generated after the presence of an edge candidate not being associated or edge candidates for which a plurality of associations are made is allowed, and thus it is possible to extract a candidate to be subjected to matching processing on the basis of the presence of a single peak, the deformation of pattern, or the possibility of a positional shift.

Figure 6A:
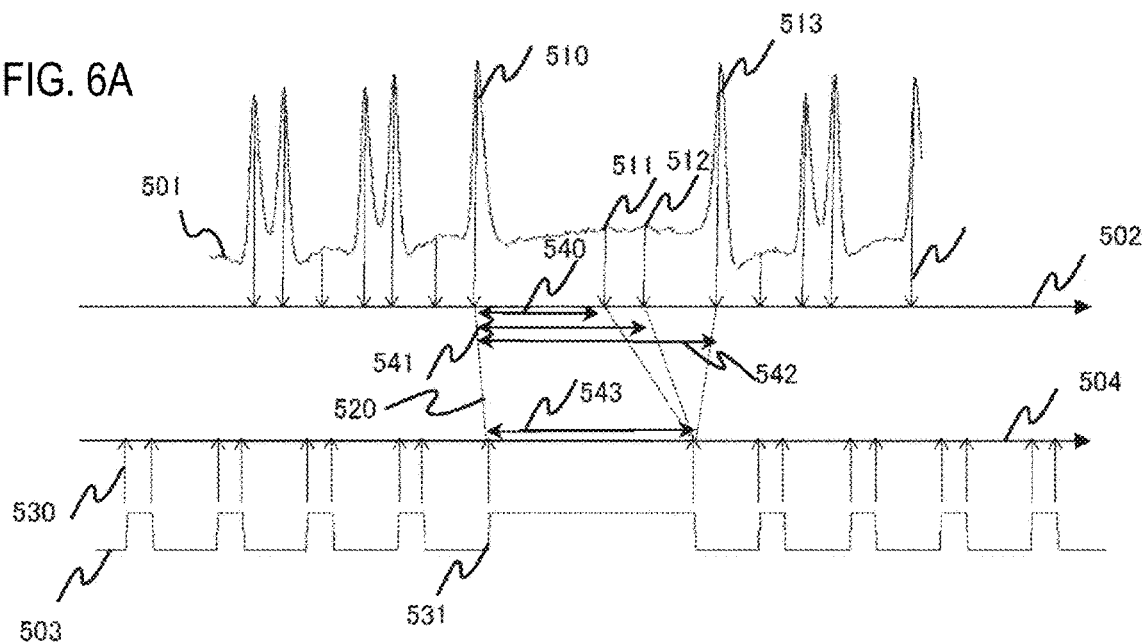
FIGS. 6A and 6B are diagrams illustrating a method of selecting the amount of relative positional shift of a pattern which is one of index values used when association between an SEM image and design data is performed.

FIG. 6 is a diagram illustrating the pattern relative positional shift amount 113 described in FIG. 1. The pattern relative positional shift amount is an index value obtained using a difference between a distance between adjacent edges in the design data and a distance between adjacent edges in the SEM image when a plurality of association candidates adjacent to each other (for example, the edges 511, 512, and 513) are present and each association is selected, for example, in the case 520 where the edge candidate 510 of the SEM image and the edge 531 of the design data image are associated with each other in FIG. 6(a). For example, considering only the edges 511, 512, and 513, a distance 540 between edges (a distance between the edge 510 and the edge 511) in the SEM image, a distance 541 (a distance between the edge 510 and the edge 512), and a distance 542 (a distance between the edge 510 and the edge 513) are obtained, while a distance between edges in the design data image is 543.

Differences between the distances include a difference between the distance 543 and the distance 540, a difference between the distance 543 and the (distance 541, and a difference between the distance 543 and the distance 542. Index values are obtained using such differences between the distances. Specifically, in a plurality of association candidates, differences between the distances are calculated by the individual associations, and are set to be index values. As the index value, for example, an absolute value of the difference between the distances or the square of the distance is simply used. Meanwhile, a method of calculating the index value is not limited thereto, and an index value indicating a difference between the distances may be used.

Incidentally, in a state where a "pattern arrangement shift" does not occur, a distance between edges to be associated in the SEM image is completely consistent with a distance between edges to be associated in the design data image (a difference between the distances is zero). On the other hand, in a case where the "pattern arrangement shift" occurs, a distance between edges to be associated in the SEM image is not consistent with a distance between edges to be associated in the design data image (a difference between the distances which has a value other than zero is included). In the plurality of association candidates described in FIG. 5, it is considered that an association candidate for which the sum of the relative positional shift amounts thereof is as small as possible is appropriate. As the sum decreases, a relative positional shift between an edge in the SEM image and an edge in the design data image decreases in view of all of the associations in the association candidates. That is, from the viewpoint of only a relative positional shift, as an association candidate has a smaller sum of the values, the association candidate becomes more appropriate for association. Meanwhile, in edge point association (discretization optimization processing) to be described later, optimization performed such that the sum of relative positional shifts is reduced, while considering other evaluation values.

Figure 6B:
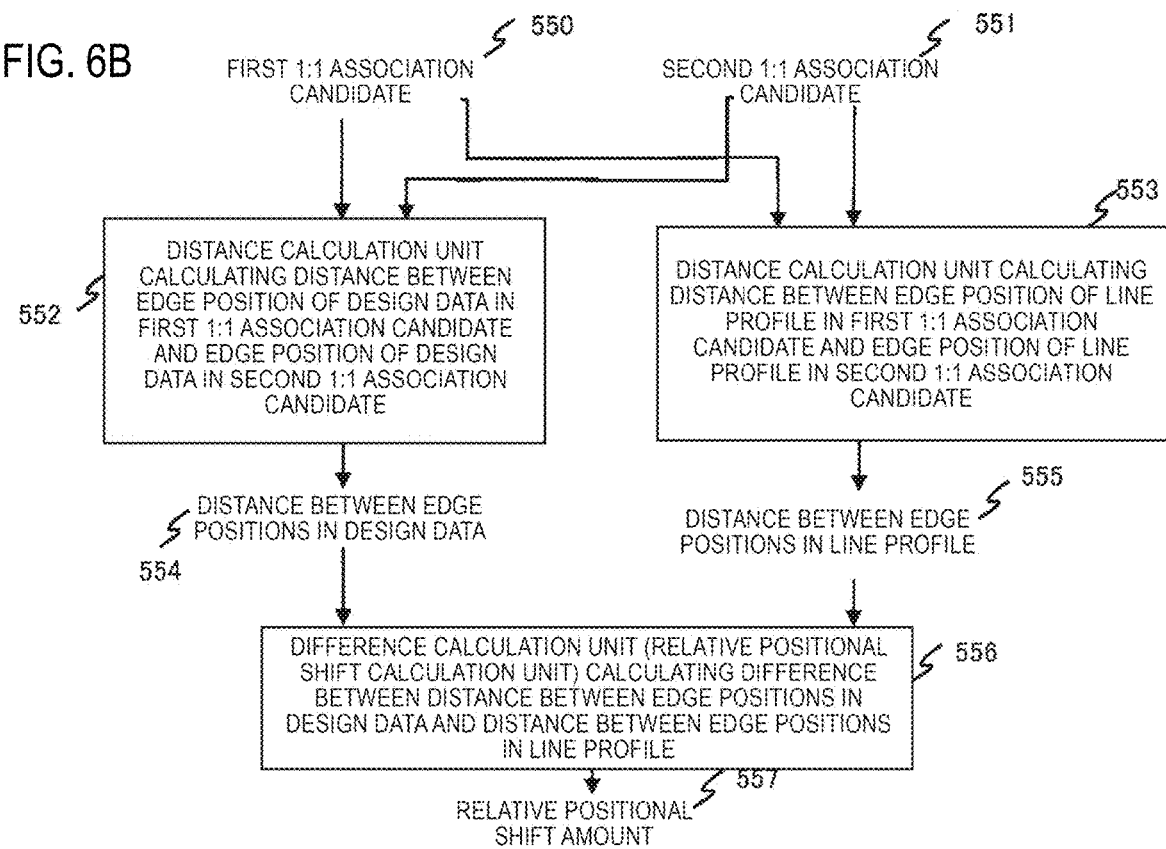

FIG. 6(b) is a block diagram of means for calculating the pattern relative positional shift amount 113. Here, one (an association candidate for one edge candidate in the SEM image and one edge in the design data image) of the associations indicated by the dashed lines 301 as illustrated in FIG. 3(a) is referred to as "1:1 association candidate" (the association candidate described in FIG. 1 holds a plurality of 1:1 association candidates). A relative positional shift 557 is obtained as follows from a first 1:1 association candidate 550 in the association candidates and a second 1:1 association candidate 551 which is adjacent to (for example, adjacent on the right side) the first 1:1 association candidate 550. First, a distance calculation unit 552 obtains a distance 554 between an edge position in design data of the first 1:1 association candidate 550 and an edge position in design data of the second 1:1 association candidate 551. Next, a distance calculation unit calculates a distance 555 between an edge position in an SEM image of the first 1:1 association candidate 550 and an edge position in an SEM image of the second 1:1 association candidate 551. A difference calculation unit 556 obtains a difference between the obtained distance 554 between the edge positions of the pieces of design data and the distance 555 between the edge positions in the SEM images. This difference is set to be the relative positional shift amount 557. As described above, it is possible to calculate an index value related to a relative positional shift between edges when an edge candidate in the SEM image and an edge in the design data image are associated with each other. Thereby, it is possible to give an index value for selecting an association candidate having a smaller amount of shift even in optimization processing allowing a case where a "pattern arrangement shift" occurs.

FIG. 7 is a diagram illustrating the ascent and descent conformity degree 112 of the pattern described in FIG. 1. The ascent and descent of the pattern refers to the ascent or descent of the side wall (edge portion in an image) of a line pattern, for example, when seen in a beam scanning direction in an SEM. In addition, the degree of conformity between the ascent and descent of a pattern in an edge candidate in an SEM image and the ascent and descent in an edge in a design data image is referred to as the ascent and descent conformity degree 112 of the pattern.

Figure 7A:
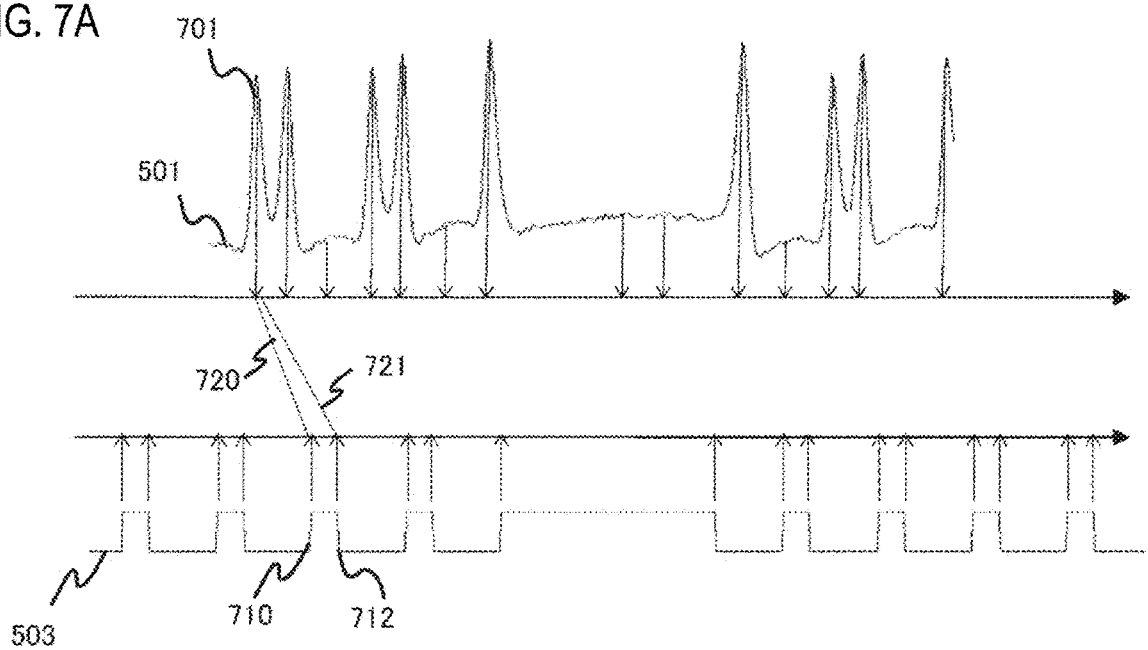
FIGS. 7A and 7B are diagrams illustrating a method of selecting the degree of conformity regarding ascent and descent which is one of index values used when association between an SEM image and design data is performed.

For example, it is assumed that a determination result for ascent and descent is ascent in an edge candidate 701 in the SEM image of FIG. 7(a). On the other hand, regarding an edge in the design data image, ascent and descent are obvious in design data. For example, an edge 710 is ascent, and an edge 711 is descent. Accordingly, for example, in a case where 1:1 association is indicated by a dashed line 720, ascent and descent conform to each other, and thus the degree of conformity is increased. On the other hand, in a case where 1:1 association is indicated by a dashed line 721, ascent and descent do not conform to each other, and thus the degree of conformity is decreased. For example, an index value calculated on the basis of the shape of a line profile in the vicinity of an edge is used for the determination of ascent and descent of the edge in the SEM image. As an example, a ratio of an inclination angle of a profile on the right side of an edge position to an inclination angle (for example, linear fitting is performed in a certain range) of a profile on the left side of the edge position in the vicinity of the edge position is set to be an index value. As a characteristic of an SEM image a semiconductor pattern, an inclination on the outer side of a line portion may be steeper than an inclination on the inner side thereof. Therefore, the index value is set such that there is a strong possibility of being ascent as the value becomes smaller from 1 and being descent as the value becomes larger from 1. A method of calculating an index value of ascent and descent is not limited thereto, and a method for determining ascent and descent at an edge candidate position may be used.

Figure 7B:
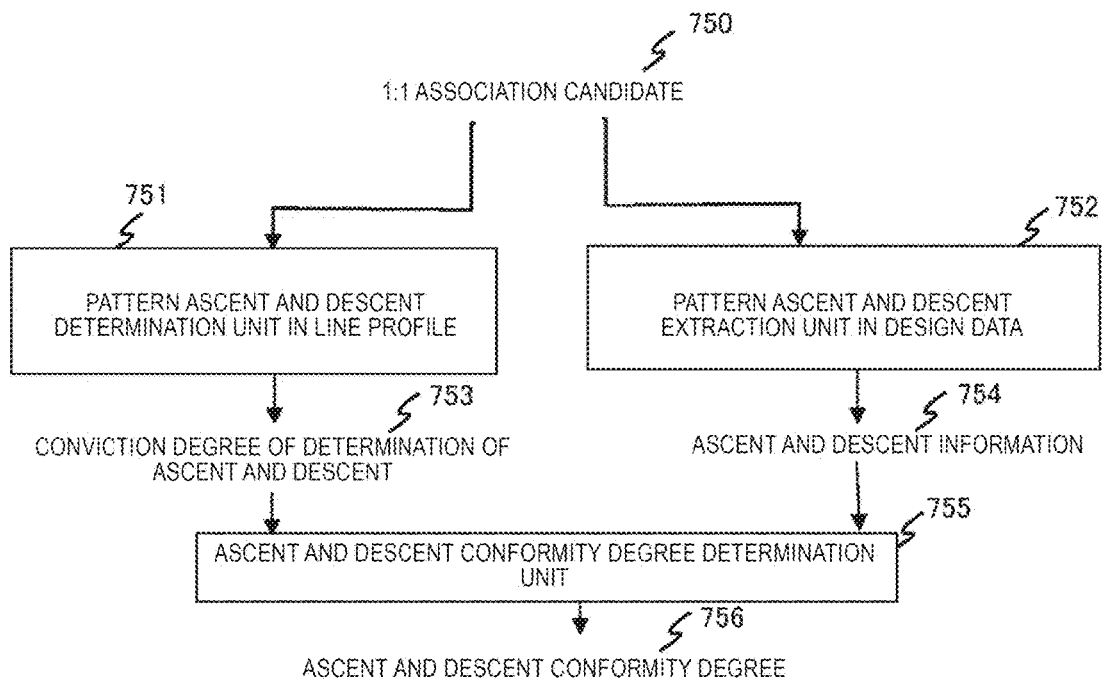

FIG. 7(b) is a block diagram illustrating means for calculating the degree of conformity between ascent and descent. In a 1:1 association candidate 750, a pattern ascent and descent determination unit 751 in an edge candidate in an SEM image determines ascent and descent by using the above-described method. In the SEM image, ascent and descent are not obvious unlike design data, and thus a result of the determination of ascent and descent is obtained in accordance with, for example, a determination conviction degree 753 (real number value). On the other hand, an ascent and descent extraction unit 752 for an edge in a design data image extracts ascent and descent information 754. An ascent and descent conformity degree determination unit 755 obtains an ascent and descent conformity degree 756 from the ascent and descent determination conviction degree 753 and the ascent and descent information 754. For example, the ascent and descent conformity degree 756 is calculated as an index value that becomes larger as the degree of conformity between ascent and descent becomes higher. It is possible to perform association even in the case as illustrated in FIG. 3(c) by using the index value.

Figure 9:
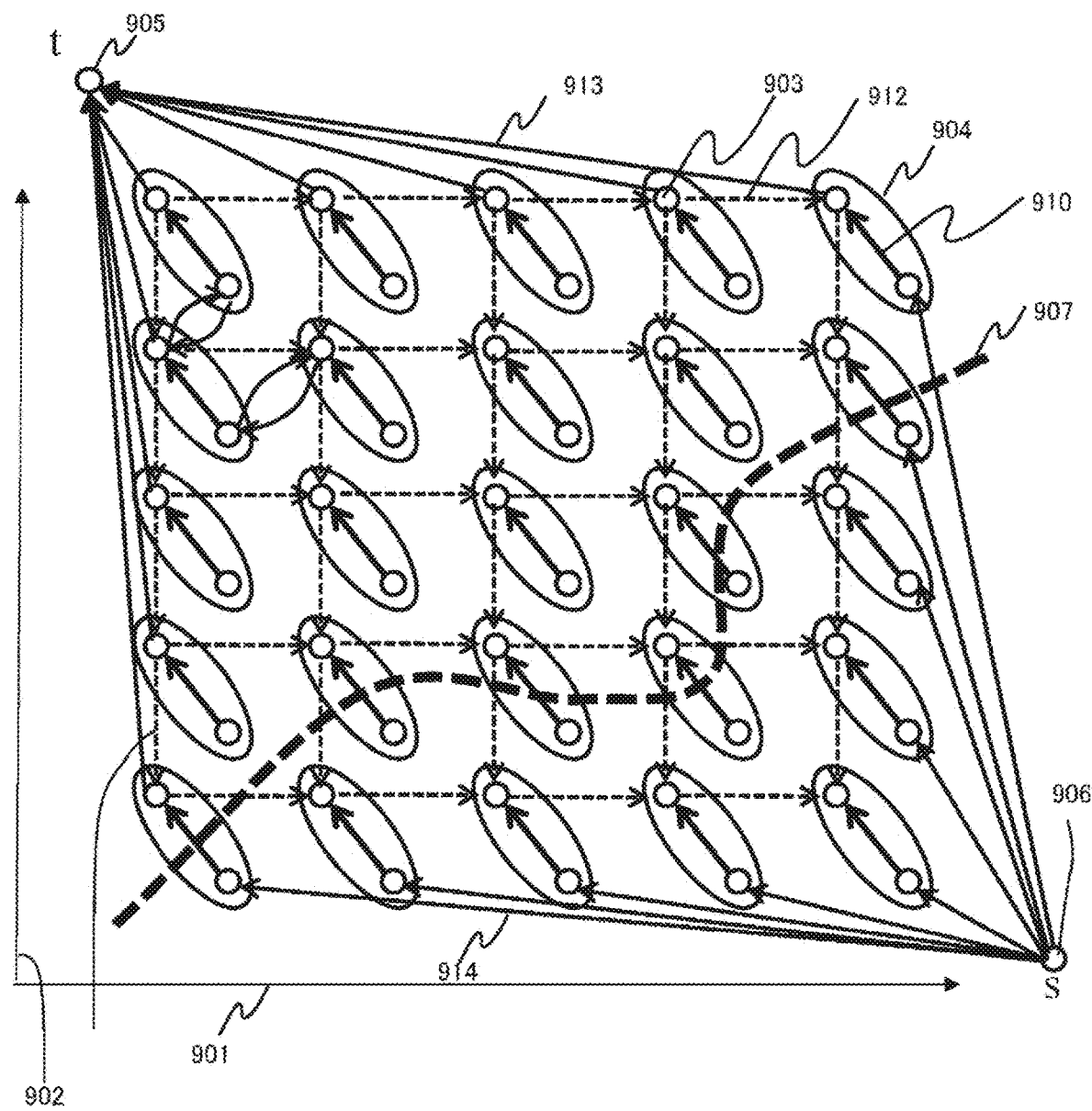
FIG. 9 is a diagram illustrating association processing of edge points used for association between an SEM image and design data.

FIG. 9 is a diagram illustrating an example of processing in the association processing unit 114 for an edge point which is described in FIG. 1. As described above, an appropriate association is selected from all association candidates. As an index value used in the selection, the edge intensity information 111, the ascent and descent conformity degree information 112, and the pattern relative positional shift amount information 113 illustrated in FIG. 1 are used. When each index value is regarded as the cost of optimization, an association for minimizing the cost may be selected from all of the association candidates, for example, in a case where a design is made so that association becomes more likely as the cost decreases. In a case of the edge intensity information, the likelihood of being considered to be a true edge increases as intensity decreases as described in FIG. 1. Therefore, as the intensity increases, the cost decreases (the possibility of being a true edge is strong). In a case of the ascent and descent conformity degree information, it is considered that association becomes more likely as the degree of conformity increases as described in FIG. 7. Therefore, the cost decreases as the degree of conformity increases.

Regarding the pattern positional shift amount information, the likelihood of being considered to be an appropriate association increases as the sum thereof decreases as described in FIG. 6. Therefore, as the positional shift amount decreases, the cost decreases. Among all association candidates, an association for minimizing the sum of costs is set to be an optimal association from all association candidates by using the cost designed in this manner. This optimal solution can be obtained using a discretization optimization method. A graph cut method as disclosed in, for example, "Optimal Elastic Matching with Non-Markov Restriction Introduced Therein: Fukutomi and Others: Image Recognition and Understanding Symposium (MIRU2011) Collection Of Learned Papers" is one of methods for solving the cost minimization problem. As a feature of this method, a global solution is necessarily obtained when a cost to be given to an arc (also referred to as a side or an edge) of a graph (directed graph) is well designed. Hereinafter, an outline of a solution using a graph cut method will be described. However, the invention is not limited to the graph cut method, and any method of solving a cost minimization problem may be used.

The point of a solution based on the graph cut method is how to design a graph. After the graph is designed, it is possible to obtain an optimal solution by a method of obtaining a minimum cut of the related art. In a case of this example, a shape as illustrated in FIG. 2 of "Optimal Elastic Matching with Non-Markov Restriction Introduced Therein: Fukutomi and Others: Image Recognition and Understanding Symposium (MIRU2011) Collection Of Learned Papers" may be used as a graph (a method of performing elastic matching by using a graph cut). This is a graph suitable for association between two signal waveforms having different aspects. When this association is similarly considered, the association can be regarded as association between two signal waveforms of a line profile in an SEM image and design data (an edge point can be regarded as a sampling point of a signal waveform).

In FIG. 9, an axis 901 represents a coordinate axis of a line profile in an SEM image, and an axis 902 represents a coordinate axis in design data. A method of using a node (for example, 903), an ellipse (for example, 904), SOURCE 906, and SINK 905 in the drawing is the same as that in the above-described literature. One of a pair of nodes surrounded by the ellipse (for example, 904) indicates one of 1:1 associations between an edge candidate in the SEM image and an edge in the design data image. A cut for minimizing a designed cost is obtained by a graph cut method, but the solution thereof is shown as, for example, a cut 907. Node pairs that are cut off by the cut 907 are optimal associations (associations for minimizing a cost) in this example. For example, the cost of an edge intensity and the cost of conformity between ascent and descent may be added to a cost (for example, 910) between node pairs.

An edge intensity is necessarily set for all of the node pairs in the graph (because each 1:1 association necessarily corresponds to any one of the edge candidates in the SEM image). In addition, as described in the above literature, a cost for a monodromy condition (for example, 911 and 912) and a starting and ending condition (for example, 913, 914) of a cut is set. FIG. 11 illustrates a portion of the graph illustrated in FIG. 9 (six node pairs are extracted). Regarding the cost of a pattern relative positional shift amount, a cost is given to an arc 955, for example, in a case of the amount of positional shift between 1:1 association of a pair of node numbers 6 and 7 and association of a pair of node numbers 19 and 18. Alternatively, a cost is given to an arc 957, for example, in a case of the amount of positional shift between 1:1 association of a pair of node numbers 6 and 7 and association of a pair of node numbers 29 and 28. In addition, it is necessary to give a cost for canceling the cost given to the arc 955 to an arc 954 and to give a cost for canceling the cost given to the arc 957 to an arc 956 so that an unnecessary cost is not generated by a cut. The giving of a cost is performed between node pairs. In addition, an arc 953 is an arc for setting a cost for controlling a case such as the single peak illustrated in FIG. 3(f). When this arc is cut off, one edge candidate in the SEM image is associated with a plurality of edges in the design data image. An arc 952 is an arc for setting a cost for controlling the pseudo edge illustrated in FIG. 3(d). When this arc is cut off, an edge candidate equivalent to the coordinates of the arc in the SEM image serves as a pseudo edge. An arc 950 is an arc for controlling a cost for controlling a case where a plurality of edges candidates in the SEM image illustrated in FIG. 3(e) are associated with one edge in the design data. When this arc is cut off, a plurality of edges candidates in the SEM image are associated with one edge in the design data.

It is possible to obtain an appropriate association by designing the above-described graph given various costs and obtaining the cut 907 having a minimum cost by a graph cut method. By this means, it is possible to obtain the associations illustrated in FIG. 3(a) and to obtain an appropriate association even in a case such as FIGS. 3(b), 3(c), 3(d), 3(e) and 3(f). Meanwhile, the costs given to the arcs in the graph shown here indicate an example of graph design, and the given costs are not limited to these contents. The graph may be a graph for realizing desired discretization optimization in edge point association processing.

FIG. 10 is a diagram illustrating an example of means (means for associating two SEM images with each other) for associating an edge in a first SEM image and an edge in a second SEM image with each other, unlike means for associating both an edge in the SEM image and an edge in the design data image as described in FIG. 1 with each other. Basic ideas are the same as those in the above description, and it may be considered that a design data image which is one of the inputs in FIG. 1 may be replaced with an SEM image.

Figure 10A:
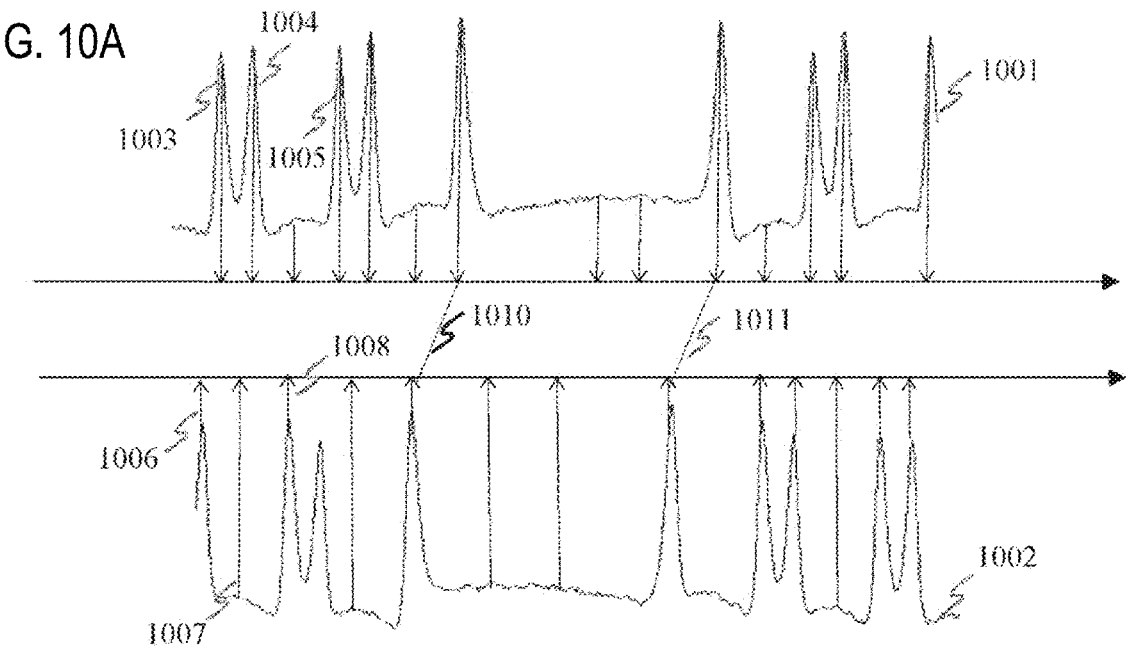
FIGS. 10A and 10B are diagrams illustrating association between edges included in two SEM images.

FIG. 10(a) illustrates a line profile 1001 of the first SEM image and a line profile 1002 of the second SEM image which are to be associated with each other. Edge candidates are extracted from the line profiles as described in FIG. 1 (here, edge candidates are extracted from each of the two line profiles). An example of the extracted edge candidate is indicated by a dashed line arrow (for example, 1003, 1004, 1005, 1006, 1007, and 1008). An example of a candidate of association between the first line profile 1001 and the second line profile 1002 is indicated by a dashed line, similar to FIG. 1 (for example, 1010 and 1011). Similarly to a description so far (here, design data is replaced with the second line profile all association combinations (association candidates) are obtained in order to obtain an appropriate association, and the likelihood (may also be expressed by a cost) of association in each association candidate is further obtained, thereby obtaining an appropriate association by discretization optimization processing.

Figure 10B:
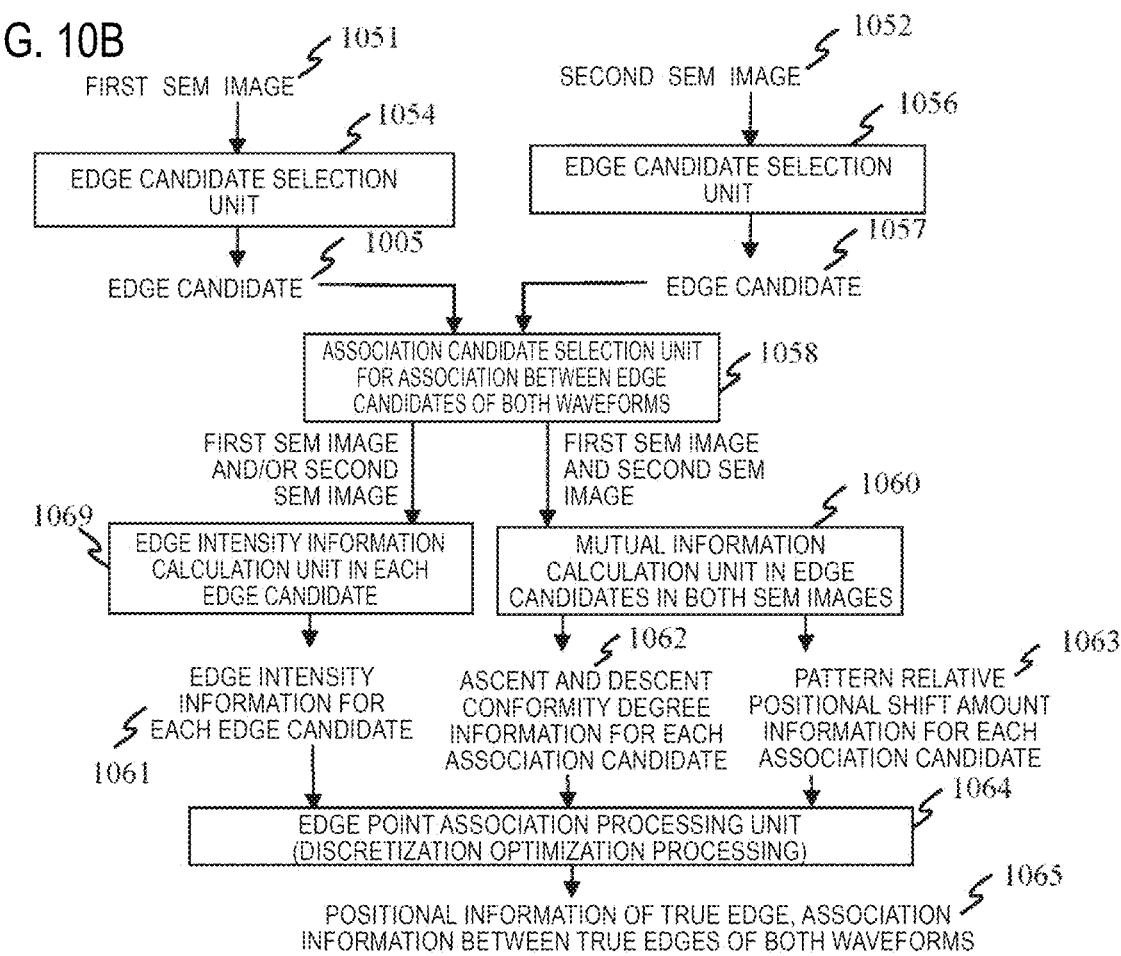

FIG. 10(b) is a block diagram illustrating the overall configuration of an example of means for associating an edge in the first line profile and an edge in the second line profile, which are acquired from the image, with each other. This drawing illustrates an example in an SEM which is mainly used for the measurement of pattern dimension of a semiconductor device (this device has been described in FIG. 4). Details will be described in the latter half of a description of FIG. 10(b). However, in this example, correct edge (true edge) information in a first SEM image 1051 and a second SEM image 1052 and association information 1065 between the true edges in both the SEM images are output by using both the SEM images as inputs. In order to obtain an appropriate association, all association combinations (association candidates) of an edge candidate 1055 in the first SEM image and an edge candidate 1057 in the second SEM image are obtained, and the likelihood (may also be expressed by a cost) of association in each association candidate is further obtained, thereby obtaining an appropriate association by discretization optimization processing.

First, as processing for the first SEM image 1051 and the second SEM image 1052, an edge candidate selection unit 1054 (or edge candidate selection unit 1056) selects an edge candidate 1055 (or an edge candidate 1057) from the first SEM image (or the second SEM image). In this processing, it is not necessary to select only a true edge, and many edge candidates of an edge are selected inclusive of erroneous edge candidates, similar to the description in FIG. 1. The erroneous edge candidates are removed by an association processing unit 1064 in post-stage processing in this block diagram, and thus the erroneous edge candidates may be included. As a method of extracting the edge candidate from the SEM image, for example, differential processing (for example, secondary differential processing) is performed on a profile (referred to as a line profile) which is generated by performing average projection on the SEM image in the longitudinal direction of a line pattern, an edge candidate having a high intensity (edge candidate having a value equal to or greater than a certain threshold value) is selected (or a zero-cross point is selected by the secondary differential processing), similar to the description in FIG. 1. Alternatively, in the line profile, a position having a maximum value is selected in front and rear pixels. A process of selecting an edge candidate is not limited thereto, and may be a process of extracting the end (edge) of a pattern. Meanwhile, noise reduction processing may be added to the line profile in advance to reduce the extraction of erroneous edges due to the influence of noise.

Examples of the noise reduction processing include moving average processing, Gaussian filtering, and the like. However, the invention is not limited thereto as long as the noise reduction processing is processing for reducing noise. Since the line profile of the SEM image has high noise, the noise reduction processing is effective in reducing an unnecessary erroneous edge candidate. As described above, the edge candidate selection unit 1054 (or the edge candidate selection unit 1056) selects the first SEM image edge candidate 1055 (or the second SEM image edge candidate 1057).

An association candidate selection unit 1058 for edges of both the first SEM image and the second SEM image selects an association candidate by using the edge candidate 1055 and the edge candidate 1057 in both the SEM images which are obtained above as inputs. In the selection of the association candidate, all combinations of the edge candidate 1055 in the first SEM image and the edge candidate 1057 in the second SEM image are basically obtained.

An edge intensity information calculation unit 1069 in each edge candidate obtains edge intensity information 1061 of each edge candidate from the line profile of the SEM image as one of indexes for selecting a true edge candidate in optimization processing at the subsequent stage. In general, as an edge becomes close to a true edge, the edge is clear, and thus the intensity of the edge is increased. On the other hand, regarding a pseudo edge and the like, the edge is blurred, and thus the intensity of the edge is low in many cases (the intensity may be reversed in the true edge and the pseudo edge. However, in this case, it is possible to correctly perform association by using other index values to be described later).

A method of calculating the intensity of an edge uses, for example, a difference between the minimum signal intensity of the line profile and a signal intensity at the position of the edge candidate, or a difference between a value of an inclination (differential value) in the vicinity of the edge candidate in the line profile or a minimum value (local minimum value) of a signal intensity in the vicinity of the edge candidate in the line profile and signal intensity of the edge candidate. The method of calculating the intensity of an edge is not limited thereto, and the end (edge) of a pattern which outputs a high index value (edge intensity information) may be used in the SEM image.

A mutual information calculation unit 1060 for the edge candidates in both the SEM images calculates an index value (accordingly, referred to as mutual information) which is obtained for each association candidate from both the edge candidate in the first SEM image and the edge candidate in the second SEM image in order to select an appropriate association in optimization processing at the subsequent stage, unlike a case of calculation from only the line profile of the first SEM image (or only the line profile of the second SEM image) in the above-described edge intensity 1169. An ascent and descent conformity degree 1062 of a pattern and a pattern relative positional shift amount 1063 in each association candidate are obtained. Here, regarding the ascent and descent conformity degree and the relative positional shift amount, an index value in each of associations between the edge in the first SEM image and the edge in the second SEM image, which is included for each association candidate, is obtained.

An association processing unit 1064 for edge points selects an appropriate association by discretization optimization processing by roughly using three index values (the edge intensity information 1061, the ascent and descent conformity degree information 1062, and the pattern relative positional shift amount information 1063) as inputs. When the result of the appropriate association is obtained, association (equivalent to each dashed line illustrated in FIG. 10(*a*)) between a true edge in the first SEM image and a true edge in the second SEM image is obtained. In addition, the position of the true edge is also known from the edge point of the SEM image which is adopted for the association. As described above, it is possible to perform association as indicated by the dashed line in FIG. 10(*a*) and to perform association even in a case where is difficult to perform collation by normal template matching (for example, a case where, when portions of patterns in the first SEM image and the second SEM image are made to conform to each other, the other portions do not conform to each other).

It is also possible to perform the alignment of measurement and inspection positions from results of the association. For example, the amount of relative positional shift (distance) between the first SEM image and the second SEM image for minimizing tale sum (or square sums) of positional shifts in the respective associations is obtained, and can be set be the amount of alignment shift which is used for the above-described alignment. A method of obtaining the amount of alignment shift amount of alignment shift (distance) is not limited thereto, and may be a method of obtaining the amount of relative shift (distance) between the first SEM image and the second SEM image. In addition, in the measurement of a desired object to be measured, when association is completed, it is possible to select an object to be measured which is a device acquisition image equivalent to an object to be measured which simply set by the design data on the basis of an association result. Then, desired measurement (for example, the measurement of a dimension, the like) may be performed. As described above, it can be understood that it is possible to perform the alignment of measurement and inspection positions or the measurement of a desired object to be measured even when the object has difficulty in template matching of the related art.

The invention claimed is:

1. A pattern matching apparatus comprising:
   a calculation processor programmed to execute pattern matching between design data and pattern data formed based on a captured image, which is captured by an imaging apparatus that is connected to the calculation processor and transmits the captured image to the calculation processor, and an image to be searched that is formed based on an output of a charged particle beam device, wherein the calculation processor associates edge candidates extracted from the design data with edge candidates in the image to be searched that have been extracted based on identified peak positions of a signal waveform generated based on the output of the charged particle beam device, including associating a plurality of the edge candidates extracted from the design data and a plurality of the edge candidates in the image to be searched, each of which is located at a different position, and not associating another edge candidate of the edge candidates extracted from the design data, performs an evaluation of the plurality of the edge candidates in the image to be searched by using index values regarding the edge candidates, and executes matching processing using an association selected through the evaluation; and wherein the pattern data includes first pattern data and second pattern data, and the calculation processor associates a plurality of edge candidates included in the first pattern data and a plurality of edge candidates included in the second pattern data with each other, and generates a plurality of association combinations having different types of association.

2. The pattern matching apparatus according to claim 1, wherein the calculation processor executes the evaluation by using an edge intensity included in the pattern data as the index value.

3. The pattern matching apparatus according to claim 1, wherein the calculation processor executes the evaluation by using a degree of conformity of ascent and descent between the edge candidates of the first pattern data and the second pattern data as the index value.

4. The pattern matching apparatus according to claim 1, wherein the calculation processor executes the evaluation by using an amount of relative positional shift between the edge candidates included in the first pattern data and the edge candidates included in the second pattern data as an index value.

5. The pattern matching apparatus according to claim 1, wherein the calculation processor selects the association based on discretization optimization processing for a plurality of types of index values.

6. The pattern matching apparatus according to claim 1, wherein the calculation processor positions an edge candidate, included in the second pattern data which corresponds to a first edge candidate included in the first pattern data, on a side closer to the first edge candidate than the edge candidate included in the second pattern data which corresponds to a second edge candidate included in the first pattern data, at the time of associating the first edge candidate and the second edge candidate with the edge candidate included in the second pattern data.

7. The pattern matching apparatus according to claim 1, wherein the calculation processor obtains a relative distance between the edge candidates included in the first pattern data and the edge candidates included in second pattern data by using the selected association and executes alignment between the first pattern data and the second pattern data so as to narrow the relative distance.

8. A non-transitory computer-readable medium storing a computer program which when executed causes a computer to execute pattern matching between design data and pattern data formed based on a captured image, which is captured by an imaging apparatus that is connected to the computer and transmits the captured image to the computer, and an image to be searched that is formed based on an output of a charged particle beam device, the computer program causing the computer to execute processes of:

receiving the captured image from the imaging apparatus;
associating edge candidates extracted from the pattern data with edge candidates in the image to be searched that have been extracted based on identified peak positions of a signal waveform generated based on the output of the charged particle beam device, including associating a plurality of the edge candidates extracted from the design data and a plurality of the edge candidates in the image to be searched, each of which is located at a different position, and not associating another edge candidate of the edge candidates extracted from the design data;
performing an evaluation of the plurality of the edge candidates in the image to be searched by using index values regarding the edge candidates; and
executing matching processing using an association selected through the evaluation;
wherein the pattern data includes first pattern data and second pattern data, and the calculation processor associates a plurality of edge candidates included in the first pattern data and a plurality of edge candidates included in the second pattern data with each other, and generates a plurality of association combinations having different types of association.

9. A pattern matching apparatus comprising:
a calculation processor programmed to execute pattern matching between design data and pattern data formed based on a captured image, the captured image being captured by an imaging apparatus connected to the calculation processor that transmits the captured image to the calculation processor, and an image to be searched that is formed based on an output of a charged particle beam device,
wherein the calculation processor associates edge candidates extracted from the pattern data with edge candidates in the image to be searched that have been extracted based on identified peak positions of a signal waveform generated based on the output of the charged particle beam device, including associating a plurality of the edge candidates extracted from the design data and a plurality of the edge candidates in the image to be searched, each of which is located at a different position, and not associating another edge candidate of the edge candidates extracted from the design data, performs an evaluation of the plurality of the edge candidates in the image to be searched by using an index value including a degree of conformity between the edge candidates, and executes matching processing using an association selected through the evaluation; and
wherein the pattern data includes first pattern data and second pattern data, and the calculation processor associates a plurality of edge candidates included in the first pattern data and a plurality of edge candidates included in the second pattern data with each other, and generates a plurality of association combinations having different types of association.

* * * * *